United States Patent [19]
Hurwitt et al.

[11] Patent Number: 5,126,028
[45] Date of Patent: Jun. 30, 1992

[54] SPUTTER COATING PROCESS CONTROL METHOD AND APPARATUS

[75] Inventors: Steven D. Hurwitt, Park Ridge, N.J.; Israel Wagner, Monsey, N.Y.; Robert Hieronymi, Rock Cavern, N.Y.; Charles Van Nutt, Monroe, N.Y.; Richard C. Edwards, Ringwood, N.J.; Donald A. Messina, Valley Cottage, N.Y.

[73] Assignee: Materials Research Corporation, Orangeburg, N.Y.

[21] Appl. No.: 570,943

[22] Filed: Aug. 22, 1990

Related U.S. Application Data

[63] Continuation-in-part of Ser. No. 339,308, Apr. 17, 1989, Pat. No. 4,957,605.

[51] Int. Cl.$^5$ .............................................. C23C 14/54
[52] U.S. Cl. .......................... 204/192.13; 204/298.03; 204/298.18
[58] Field of Search ....................... 204/192.13, 298.03

[56] References Cited

U.S. PATENT DOCUMENTS

| | | | |
|---|---|---|---|
| 4,166,783 | 4/1979 | Turner | 204/192.13 |
| 4,172,020 | 10/1979 | Tisone et al. | 204/192.13 |
| 4,401,539 | 3/1983 | Abe et al. | 204/192.13 |
| 4,444,635 | 12/1985 | Kobayashi et al. | 204/192.15 |
| 4,500,408 | 6/1985 | Boys et al. | 204/298.03 |
| 4,500,409 | 7/1985 | Boys et al. | 204/298.03 |
| 4,569,482 | 5/1986 | Hiruma et al. | 239/224 |
| 4,595,482 | 2/1986 | Mintz | 204/298.03 |
| 4,622,121 | 9/1986 | Wegmann et al. | 204/298.18 |
| 4,734,183 | 1/1988 | Wirz et al. | 204/298.2 |
| 4,761,218 | 11/1988 | Boys | 204/298.19 |
| 4,795,529 | 10/1989 | Kawasaki et al. | 156/643 |
| 4,810,346 | 1/1989 | Wolf et al. | 204/298.12 |
| 4,842,703 | 11/1989 | Class et al. | 204/192.12 |
| 4,865,710 | 9/1989 | Aaron et al. | 204/192.12 |
| 4,902,394 | 10/1990 | Kenmotsu et al. | 204/192.12 |
| 4,957,605 | 9/1990 | Hurwitt et al. | 204/192.12 |
| 4,963,239 | 7/1990 | Shimamura et al. | 204/192.12 |
| 4,967,337 | 6/1990 | English et al. | 364/184 |

FOREIGN PATENT DOCUMENTS 2-88772  3/1990  Japan ................. 204/298.03

*Primary Examiner*—Aaron Weisstuch
*Attorney, Agent, or Firm*—Wood, Herron & Evans

[57] ABSTRACT

A sputter coating apparatus displays set and alternative machine parameters, entered or calculated from entered or measured data, for selection by the operator. The apparatus performs a sputter coating process to produce sputter coated articles in accordance with the selected machine parameters. Process parameters familiar to the person creating the process, such as desired coating thickness and desired deposition rate, may be entered by the operator. Measured data such as actual coating thickness at a plurality of points on a previously processed wafer may be entered by an operator or automatically measured from a wafer. Alternative machine parameters such as target sputtering power may be entered by an operator or calculated from entered process parameters or measured data. The operator selects and initiates a process in accordance with the selections by entering commands. The machine parameters control separately the sputtering from different regions of the sputtering surface of a one piece sputtering target by alternately energizing different plasmas over the different target regions and energizing the target in accordance with different machine parameters.

72 Claims, 13 Drawing Sheets

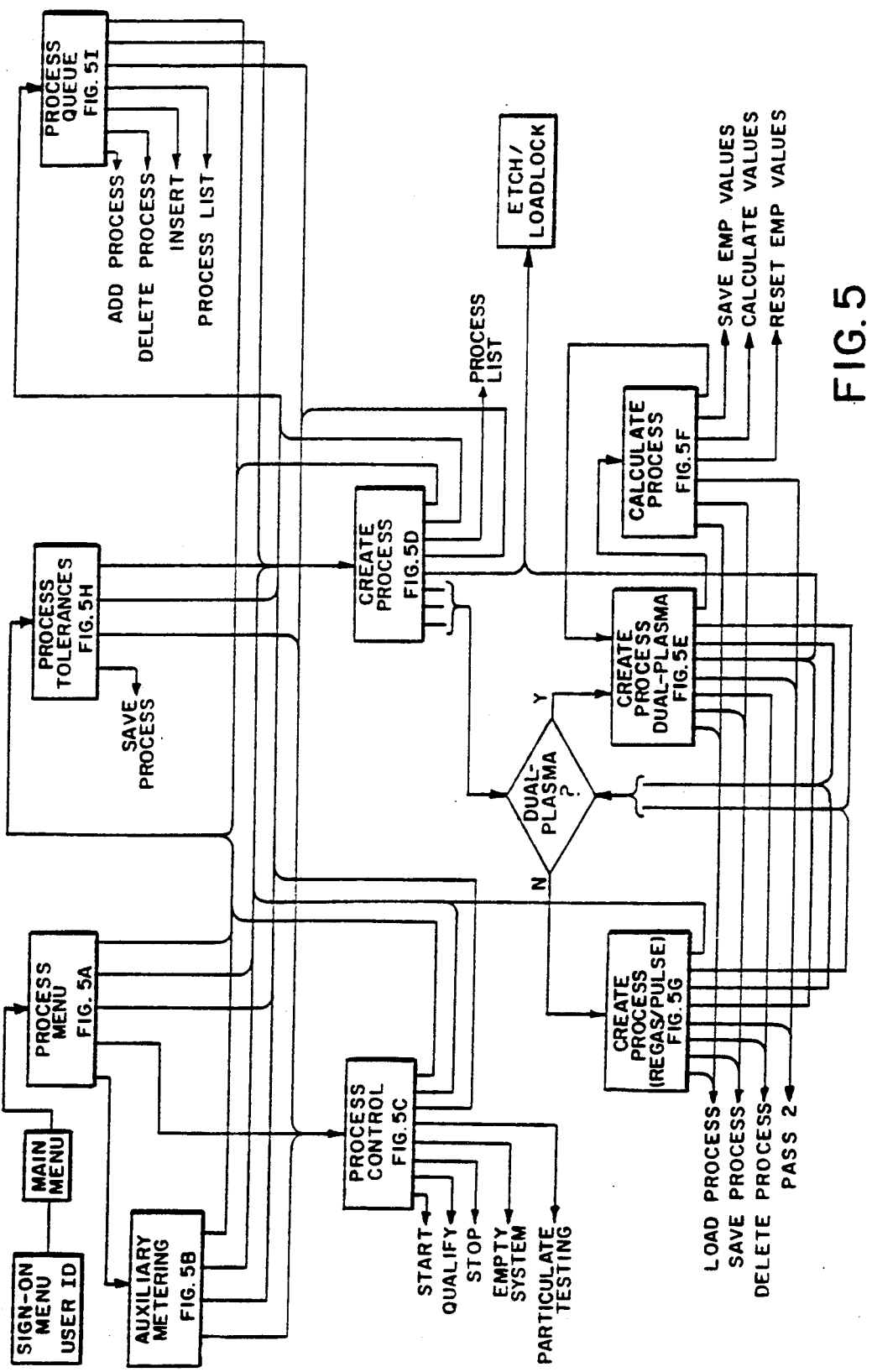

JAN 02  AUXILIARY METERING MENU  06:18

| POD | WFR PRESS | IN PWR KW | OUT PWR KW | IN HIGH COIL AMP | IN LOW COIL AMP | OUT HIGH COIL AMP | OUT LOW COIL AMP |
|---|---|---|---|---|---|---|---|
| ETCH | 00.0 TORR | | | | | | |
| SPUT1 | 00.0 TORR | 00.0 | 00.0 | 0.0 | 0.0 | 0.0 | 0.0 |
| SPUT2 | 00.0 TORR | 00.0 | 00.0 | 0.0 | 0.0 | 0.0 | 0.0 |
| SPUT3 | 00.0 TORR | 00.0 | 00.0 | 0.0 | 0.0 | 0.0 | 0.0 |

| F1 | F2 | F3 | F4 | F5 | F6 | F7 | F8 |
|---|---|---|---|---|---|---|---|
| | | | | PROCESS CONTROL | PROCESS QUEUE | CREATE PROCESS | PROCESS TOLER. |

FIG.5B

| JAN 02 | PROCESS CONTROL | 06:11 |

BATCH ID:
PROCESS ID:  NO. CASSETTES:
WAFERS PROCESSED:

| CASS A B | PROCESS CHAMBER | TEMP. deg C | ETCH Volts | SPUT V/KW | BIAS Volts | ARGON Sccm | PRESSURE Torr/mTorr | REGAS 1st | 2nd |
|---|---|---|---|---|---|---|---|---|---|
| 6 | ETCH | 0 | 0 | | | 0 | 0.0x10-0 | 0.0 | 0.0 |
| 5 | SPUT 1 | 0 | | 30.0 | 0 | 0 | 0.0x10-0 | 0.0 | 0.0 |
| 4 | SPUT 2 | 0 | | 30.0 | 0 | 0 | 0.0x10-0 | 0.0 | 0.0 |
| 3 | SPUT 3 | 0 | | 0 | 0 | 0 | 0.0x10-0 | 0.0 | 0.0 |
| 2 | L/LOCK | 0 | | | PLENUM | | 0.0x10-0 | | |

PASS:
LAST PASS CYCLE TIME:        SECONDS

| F1 | F2 | F3 | F4 | F5 | F6 | F7 | F8 |
|---|---|---|---|---|---|---|---|
| START | QUALIFY | STOP | EMPTY SYSTEM | PARTIC. TEST | PROCESS QUEUE | CREATE PROCESS | PROCESS TOLER. |

FIG. 5C

JAN 02  CREATE PROCESS (SPUT1)    06:12

PROCESS ID: TEST BATCH 1  CREATED BY:  ON: 06/20/06  10:27:18
DESCRIPTION: DEFAULT PARAMETERS  CHANGED BY:  ON: 06/22/06  02:26:48

| FIXED PROCESS FUNCTIONS | | STEP FUNCTIONS | | STEP 1 | STEP 2 | STEP 3 |
|---|---|---|---|---|---|---|
| BP TEMP. | (C) | 000 | OUTER PWR (KW) | 00.0 | 00.0 | 00.0 |
| SPUT DELAY | (SEC) | 00 | INNER PWR (KW) | 00.0 | 00.0 | 00.0 |
| BIAS DELAY | (SEC) | 00 | TIME (SEC) | 000 | 000 | 000 |
| PUMP OUT | (SEC) | 00 | ARGON (SCCM) | 000 | 000 | 000 |
| VACUUM | (TORR) | 0.0x10-0 | BP GAS (Y/N) | N | N | N |
| DUTY CYC | (% OUTER) | 00 | DEP RTE (Å/SEC) | 000 | 000 | 000 |
|  |  |  | THICKNESS (μ) | 0.00 | 0.00 | 0.00 |
|  |  |  |  |  |  | PASS 1 |

| F1 | F2 | F3 | F4 | F5 | F6 | F7 | F8 |
|---|---|---|---|---|---|---|---|
| LOAD PROCESS | SAVE PROCESS | DELETE PROCESS | PASS 2 | CREATE ETCH/LL | CREATE SPUT 2 | CREATE SPUT 3 | CALC PROCESS |

"DUAL-PLASMA"

FIG. 5E

JAN 02 CALCULATE PROCESS - SPUT1   06:12

PROCESS ID:   TEST BATCH 1            CREATED BY:          ON: 05/20/88   10:27:18
DESCRIPTION:  DEFAULT PARAMETERS      CHANGED BY:          ON: 05/22/88   02:29:48

| EMPIRICAL VALUES | | PROCESS VALUES | | Step 1 | Step 2 | Step 3 |
|---|---|---|---|---|---|---|
| OUTER POWER | (KILOWATTS) | 00.0 | DEP RTE (Å/SEC) | 000 | 000 | 000 |
| INNER POWER | (KILOWATTS) | 00.0 | THICKNESS (µ) | 0.00 | 0.00 | 0.00 |
| MEAS THICKNESS OUTER (µ) | | 0.00 | DERIVED VALUES | STEP 1 | STEP 2 | STEP 3 |
| MEAS THICKNESS INNER (µ) | | 0.00 | OUTER PWR (KW) | 00.0 | 00.0 | 00.0 |
| TIME | (SECONDS) | 000 | INNER PWR (KW) | 00.0 | 00.0 | 00.0 |
| DUTY CYCLE | (% OUTER) | 0 0 | TIME (SECONDS) | 000 | 000 | 000 |
| KILOWATT HOURS | | 007 | DTY CYC (% OUT) | 0 0 | 0 0 | 0 0 |
|  |  |  |  |  |  | PASS 1 |

| F1 | F2 | F3 | F4 | F5 | F6 | F7 | F8 |
|---|---|---|---|---|---|---|---|
| LOAD PROCESS | SAVE PROCESS | PASS 2 | RESET EMP VALUES | CALCULATE VALUES | SAVE EMP VALUES |  | CREATE SPUT 1 |

FIG.5F

JUL 22  CREATE PROCESS (SPUT1)                 08:58

PROCESS ID: TEST BATCH 1           CREATED BY:        ON: 05/20/86  10:27:18
DESCRIPTION: DEFAULT PARAMETERS    CHANGED BY:        ON: 05/22/86  02:29:48

| FIXED PROCESS FUNCTIONS | | STEP FUNCTIONS | | STEP 1 | STEP 2 | STEP 3 |
|---|---|---|---|---|---|---|
| BP TEMP. | (C) 000 | DC PWR | (KW) | 00.0 | 00.0 | 00.0 |
| SPUT DELAY | (SEC) 0 0 | BIAS | (VOLT) | 00.0 | 00.0 | 00.0 |
| BIAS DELAY | (SEC) 0 0 | TIME | (SEC) | 000 | 000 | 000 |
| PUMP OUT | (SEC) 0 0 | ARGON | (SCCM) | 000 | 000 | 000 |
| VACUUM | (TORR) 0.0x10--0 | BP GAS | (Y/N) | Y | Y | Y |
| REGAS 1 | (TYPE) | REGAS 1 | (SCCM) | 00.0 | 00.0 | 00.0 |
| REGAS 2 | (TYPE) | REGAS 2 | (SCCM) | 00.0 | 00.0 | 00.0 |
| PULSE ON/OFF | (SEC) 0.00/1.00 | | | | | PASS 1 |

"REGAS/PULSE"

| F1 | F2 | F3 | F4 | F5 | F6 | F7 | F8 |
|---|---|---|---|---|---|---|---|
| LOAD PROCESS | SAVE PROCESS | DELETE PROCESS | PASS 2 | CREATE ETCH/LL | CREATE SPUT 2 | CREATE SPUT 3 | CREATE PRC SCR |

FIG. 5G

JUL 22   PROCESS TOLERANCES   08:59

PROCESS ID: TEST BATCH 1  CREATED BY:   ON: 05/20/86  10:27:18
DESCRIPTION: DEFAULT PARAMETERS  CHANGED BY:   ON: 05/22/86  02:29:48

| FUNCTION | ETCH | | SPUT1 | | SPUT2 | | SPUT3 | | LOADLOCK | |
|---|---|---|---|---|---|---|---|---|---|---|
| | FLT | WRN | FLT | WRN | FLT | WRN | FLT | WRN | FLT | WRN |
| ETCH VOLTAGE | 15 % | 10 % | | | | | | | | |
| SPUT POWER | | | 15 % | 10 % | 15 % | 10 % | 15 % | 10 % | | |
| BIAS VOLTAGE | | | 15 % | 10 % | 15 % | 10 % | 15 % | 10 % | | |
| GAS FLOW | 15 % | 10 % | 15 % | 10 % | 15 % | 10 % | 15 % | 10 % | | |
| TEMPERATURE | 15 % | 10 % | | | | | | | 15 % | 10 % |

| F1 | F2 | F3 | F4 | F5 | F6 | F7 | F8 |
|---|---|---|---|---|---|---|---|
| | SAVE PROCESS | | | PROCESS CONTROL | PROCESS QUEUE | CREATE PROCESS | |

FIG. 5H

JUL 22  PROCESS CONTROL QUEUE  08:57

| QUEUE NUMBER | BATCH ID | PROCESS ID | NUMBER OF CASSETTES |
|---|---|---|---|
| (TOP) 1 | | | 00 |
| 2 | | | 00 |
| 3 | | | 00 |
| 4 | | | 00 |
| 5 | | | 00 |
| 6 | | | 00 |

QUEUE ENTRY: 00

| F1 | F2 | F3 | F4 | F5 | F6 | F7 | F8 |
|---|---|---|---|---|---|---|---|
| ADD | DELETE | INSERT | PROCESS LIST | PROCESS CONTROL | | CREATE PROCESS | PROCESS TOLER. |

FIG. 5I

SPUTTER COATING PROCESS CONTROL METHOD AND APPARATUS

This application is a continuation-in-part of U.S. patent application Ser. No. 07/339,308, filed Apr. 17, 1989 and now U.S. Pat. No. 4,957,605.

The present invention relates to the control of sputter coating processes and, more particularly, to a method and apparatus for controlling sputter coating processes by users of sputter coating machines.

BACKGROUND OF THE INVENTION

Sputter coating is a process carried out in a vacuum chamber, typically filled with either a chemically inert gas or a reactive gas, in which a substrate to be coated is mounted facing a target formed of the coating material. In the chamber, the target is subjected to an electrical potential negative with respect to the chamber wall or some other anode within the chamber to produce a potential gradient that causes electrons to be emitted from the target and attracted toward the chamber anode. The emitted electrons move toward the anode, and while moving strike and ionize atoms of the inert gas by stripping electrons from them. Positive ions of the gas are thereby formed and attracted toward the negatively charged target which they strike, transferring momentum to the target material, and ejecting particles of the material from the target surface. The substrate to be coated, which is positioned in the chamber usually with its surface facing the target so as to intercept the moving particles of coating material sputtered from the target, receives some of the ejected particles, which adhere to and coat the substrate surface.

In magnetron enhanced sputtering processes, a magnetic field is formed over the target surface with the magnetic field having component lines extending parallel to the target surface. In many applications, the field lines arch over the target surface and form a closed magnetic tunnel. The magnetic field causes the electrons moving from the target to curve in spiral paths over regions of the target surface enclosed by the field, thereby increasing the electron density in the enclosed space, and resulting in an increase in the rate of electron collisions with gas atoms over the enclosed regions of the target surface. The increased collision rate in turn increases the ionization of the gas in the enclosed space and thus increases the efficiency of the sputtering process at the underlying target region. Where the magnetic field is sufficiently strong over the target surface, a glowing ion cloud or plasma is seen trapped within the field over the region of the target surface In the commonly assigned and copending U.S. patent application Ser. No. 07/339,308, filed Apr. 17, 1989, now U.S. Pat. No. 4,957,605, entitled "Method and Apparatus for Sputter Coating Stepped Wafers," expressly incorporated herein by reference, a sputter coating apparatus and method are disclosed in which a single-piece concave annular target is provided with a pair of concentric annular electromagnets having concentric annular pole pieces behind and at the rim of the target. The fields produced by these magnets cause the formation of a pair of concentric plasma rings overlying concentric sputtering regions on the target surface. The two plasma rings are alternately energized by alternately supplying current to the magnet coils while the target power is switched between two controlled power levels in synchronization with the switching of the current to the magnetic coils. This causes the two target regions to be alternately activated so that the sputtering from the regions is alternately switched on and off. This switching provides different controllable rates of sputtering from inner and outer concentric regions of the surface of the sputtering target.

Separate control of the sputtering from the plural target regions enables the control of the distribution characteristics of the sputtered material deposited on the surface of the substrate or wafer being coated. A varying of the relative parameters affecting the energization of the two target regions, as for example the "on" power levels or the relative duty cycles of the activation of the target regions, provides control of coating uniformity on the substrate surfaces. This control is especially important where differently facing surfaces of substrates, such as steps on the surfaces of semiconductor wafers, must be uniformly coated. The aforereferenced U.S. Pat. No. 4,957,605 particularly describes in detail certain effects on the coating uniformity caused by target and substrate geometry and by the electrical parameters relating to the energization of the target and the plasmas.

By its very nature, cathode sputter coating involves the removal of material from the sputtering target and the deposition of the sputtered material onto the substrate surface. The removal of material from the cathode sputtering target consumes the target, changing the shape of the target surface and reducing the thickness of the target until eventually an erosion groove extends to the back surface of the target. The erosion of the target surface is usually uneven, being concentrated in areas which underlie the denser regions of ion concentration or plasmas in the space above the target adjacent the target surface. The formation of this erosion groove alters the performance of the sputtering target, generally with a declining emission rate from the sputtering target region, a phenomenon referred to as rate "roll-off". Compensation for the effect of a declining deposition rate is usually achieved by progressively increasing the power applied to the target over the course of the useful target life in order to maintain an acceptable or even constant deposition rate onto the substrates.

With magnetron sputtering devices the plasmas are generally confined to one or more regions of a target surface, in part due to design requirements of the magnet structure, and in part due to certain performance requirements which necessitate the location of the plasmas in specific geometric positions in relation to the substrate surfaces to achieve a desired coating distribution on the substrate. Because the positions of the plasmas determine the locations from which the sputtering material is emitted, which determines the corresponding distribution of the deposited coating material on the substrate surface, movement of the plasmas, while smoothing target erosion, can interfere with the achievement of coating uniformity. Precise differential control of sputtering rates from different sputtering regions on a sputtering target is important in achieving the uniformity of the deposited coating on the substrate. It is not only target erosion that affects the uniformity of coatings on substrates, but pressures, temperatures, gas compositions, material properties and property uniformity of targets and substrates, device configurations on the wafer surfaces and process step sequences which require variations in process parameters to achieve high coating quality uniform coatings. Not all factors which affect the coatings are easily or accurately predictable.

In bias sputtering, a voltage which is negative, but less negative than that imposed on the target, is applied to the substrate being coated. This bias voltage causes a certain amount of "back sputtering," or sputtering from the coating which has been deposited on the substrate surface, due to the impingement of ions produced by electrons emitted from the substrate. In some, but not all, sputter coating processes, bias sputtering is desirable to impart certain properties to substrate surface.

The complete processing of a semiconductor wafer involves a number of subprocess steps, not all of which are sputter coating processes. Semiconductor wafers are manufactured by a sequence of processes by which layers of conductive or insulative material are selectively deposited onto and removed from the surface of a wafer substrate. Removal of layers or portions of layers may be by a sputter etching process, a process in which the substrate is biased without the presence of a sputtering target so that ions bombard the substrate surface to remove material therefrom.

Both sputter coating and sputter etching processes may take place in the presence of an inert gas such as argon or the presence of a reactive gas such as oxygen, chlorine, or nitrous oxide. A reactive gas may facilitate the deposition or removal of material from the wafer or may combine with the surface material or otherwise impart certain desirable properties to the wafer being processed.

Each of the processes performed on semiconductor wafers requires the control of not only the applicable electrical parameters such as target and substrate voltage, current and power, magnetic field placement and strength, and the timing of the application of the electrical parameters, but also of the pressures and flows of various gasses, the maintenance of temperatures of targets, wafers and gasses, and other factors which affect the process.

In addition, machines for processing the wafers are designed in many different forms. In sputter processing machines such as those described in U.S. Pat. Nos. 4,909,695 and 4,915,564, for example, both assigned to the assignee of the present application and both hereby expressly incorporated herein by reference, methods and apparatus for sequentially performing a plurality of different processes on wafers in a single main vacuum chamber, having therein separately isolatable process chambers, are disclosed. At each of the chambers, in the apparatus of the above incorporated patents, up to five different wafers can be processed simultaneously, one at each of the chambers, and each through five processing steps performed in different chambers. Between the performance of each of the processing steps, the chambers are opened, the wafers are moved from chamber to chamber, wafers are cycled into and out of the machine through a loadlock, the chambers are resealed and the atmospheres in them returned to the controlled environments needed for the processes performed in them. All of the steps and substeps in the machine sequences must be controlled in synchronism with the control of the steps of the various processes.

Wafer processing machines have been provided with controls which regulate or vary process parameters or maintain parameters at certain setpoints. The sequencing of process steps and the movement of wafers through the apparatus are also controlled. Some of the machine controls have employed closed loop feedback control of certain parameters or programmed control of process sequences.

Over the course of running processes on wafers, however, the need to change parameter setpoints, modify program steps or sequences, and otherwise alter the course of machine operation is often desirable. The ability of the machines to repeat processes and maintain parameter control automatically does, in many cases, improve the efficiency and quality control of the performed processes. The need for such changes, however, is not always predictable and the responses to observable performance deviations is not always capable of control by control algorithms programmed into the machines. Human operator intervention and human decision making in the modification of the machine process setpoints and control programs is, in many cases, necessary. The speed and efficiency with which such changes can be made often determines the ultimate quality and efficiency which is attainable with the equipment. Machines of the prior art have not adequately provided for automated control which is sufficiently flexible to allow for the optimum input from the operator.

Accordingly, there is still an unfulfilled need in the prior art for effective interface between automated wafer process control and user decision making.

SUMMARY OF THE INVENTION

It is a primary objective of the present invention to improve the monitoring and control of the processes of a wafer-like article processing machine. It is a particular objective of the present invention to provide programmed control of a processing apparatus, such as a sputter coating or etching machine, and provide the user of the processing apparatus with the ability to monitor and vary, according to the experience and judgment of the user, the programmed parameters of the machine. It is a further objective of the present invention to provide the user of a wafer-like article processing apparatus with automated monitoring and process analysis and programmed process control in a form which can be interactively combined with the judgment and experience of the user in the operation of the machine.

It is a further objective of the present invention to provide a processing machine control capable of accepting input parameters in a form familiar to the user and converting those parameters into parameters useful to the operating program of the machine. It is still a further objective of the present invention to provide the user of an apparatus for processing wafers and the like with rapid access to entered, measured and calculated data, including advisory information for modifying user accessible parameters of the machine and processes, to facilitate the input of commands and parameter setting data in accordance with the judgment and experience of the user. It is a more particular objective of the present invention to provide a user of a wafer processing apparatus with rapid and informed control over the automated functions of the machine and programmed control sequences of the machine, particularly the ability to vary such processes in response to changing conditions and desired changes in the product being produced.

It is an additional objective of the present invention to provide a user of such a processing apparatus with the improved capability of monitoring and controlling the processing of a plurality of different wafers according to a plurality of different processes performed in accordance with a plurality of different sequences.

In accordance with the principles of the present invention, there is provided a wafer-like article processing apparatus having a user interface and control through which the processes of the apparatus are controlled in response to information of current and prior measured, set or programmed data, or user determined variations thereof. The interface preferably displays to the user data of actual measured parameters, current or prior parameter settings, and calculated or suggested variations in parameter settings, and accepts commands of the user and data input by the user to either accept of override control settings of the machine. The control functions may include those directly responsive to measured, set or calculated values or those responsive to the exercise of user discretion.

In accordance with one preferred embodiment of the present invention, an operator interface which displays current programmed values of parameters, displays measured data from prior runs, whether obtained and entered manually or automatically, and calculates alternative suggested settings of parameters to the operator. The interface, more particularly, is provided in combination with a two-plasma one-piece target and cathode assembly, to monitor and control the parameters associated with the operation of such a sputtering system.

The control and interface of the preferred embodiment of the invention is selectively operable in a calculating mode. In the calculating mode data are entered by the user in parameters familiar to the user and converted to parameters useful to a machine-stored program. Measured data from prior depositions is also received. Input parameters include, for example, process parameters such as deposition rate and desired coating thickness, which are meaningful to the process engineer, operator supervisor, or other person responsible for defining the processes to be run. Also input may be programmed values for inner and outer target region power levels, the duty cycles of operation of each sputtering region of the target, process time, target power limits, and other program value settings. Measured inner and outer wafer region coating thickness from prior depositions and lifetime target energy consumption may also be received by the system. New values for the machine parameters such as inner and outer target region power, process time and duty cycle are calculated by a programmed microprocessor. The calculated values may automatically replace previously programmed parameter values or, preferably, are displayed for the operator to accept, reject or use to modify the previous settings.

In accordance with other principles of the present invention, monitoring and control of anode voltage between two levels, in accordance with the above interface features, in synchronism with the switching of the plasmas to enhance the sputter coating of the substrate from the two target regions is also provided. Specifically advantageous monitoring and control of other parameters of a sputtering system are set forth in the detailed description below.

In addition, each wafer to be processed is identified as to its initial position in the wafer storage cassettes, and the location of the wafer is tracked through each process step so that the processes performed on each wafer and the parameters applicable thereto are recorded for analysis and refinement of future machine settings.

These and other objectives and advantages of the present invention are more readily apparent from the following detailed description of the drawings in which:

BRIEF DESCRIPTION OF THE DRAWINGS

FIG. 5 is a block diagram of the user interface program of the control portion of the apparatus of FIG. 1.

FIG. 5B is an illustration of the Auxiliary Metering menu display of the interface of FIG. 5.

FIG. 5C is an illustration of the Process Control menu display of the interface of FIG. 5.

FIG. 5E is an illustration of the Create Process menu display, for pulse and reactive gas sputtering chambers, of the interface of FIG. 5.

FIG. 5F is an illustration of the Calculate menu display of the interface of FIG. 5.

FIG. 5G is an illustration of the Create Process menu display, for a two plasma target sputtering chamber, of the interface of FIG. 5.

FIG. 5H is an illustration of the Process Tolerances menu display of the interface of FIG. 5.

FIG. 5I is an illustration of the Process Control Queue menu display of the interface of FIG. 5.

DETAILED DESCRIPTION OF THE DRAWINGS

Magnetron sputtering devices of the type to which the present invention relates are described in the following commonly assigned U.S. patents and copending patent applications which are hereby expressly incorporated in their entirety into this application by reference:

U.S. Pat. No. 4,855,033 for "Cathode Target Design for a Sputter Coating Apparatus";

U.S. Pat. No. 4,871,433 for "Apparatus for Improving the Uniformity of Ion Bombardment In a Magnetron Sputtering System";

U.S. Pat. Nos. 4,909,695 and 4,915,564 entitled "Method and Apparatus for Handling and Processing Wafer-Like Materials"; and, U.S. Pat. No. 4,957,605, entitled "Method and Apparatus for Sputter Coating Stepped Wafers."

Figure 1:
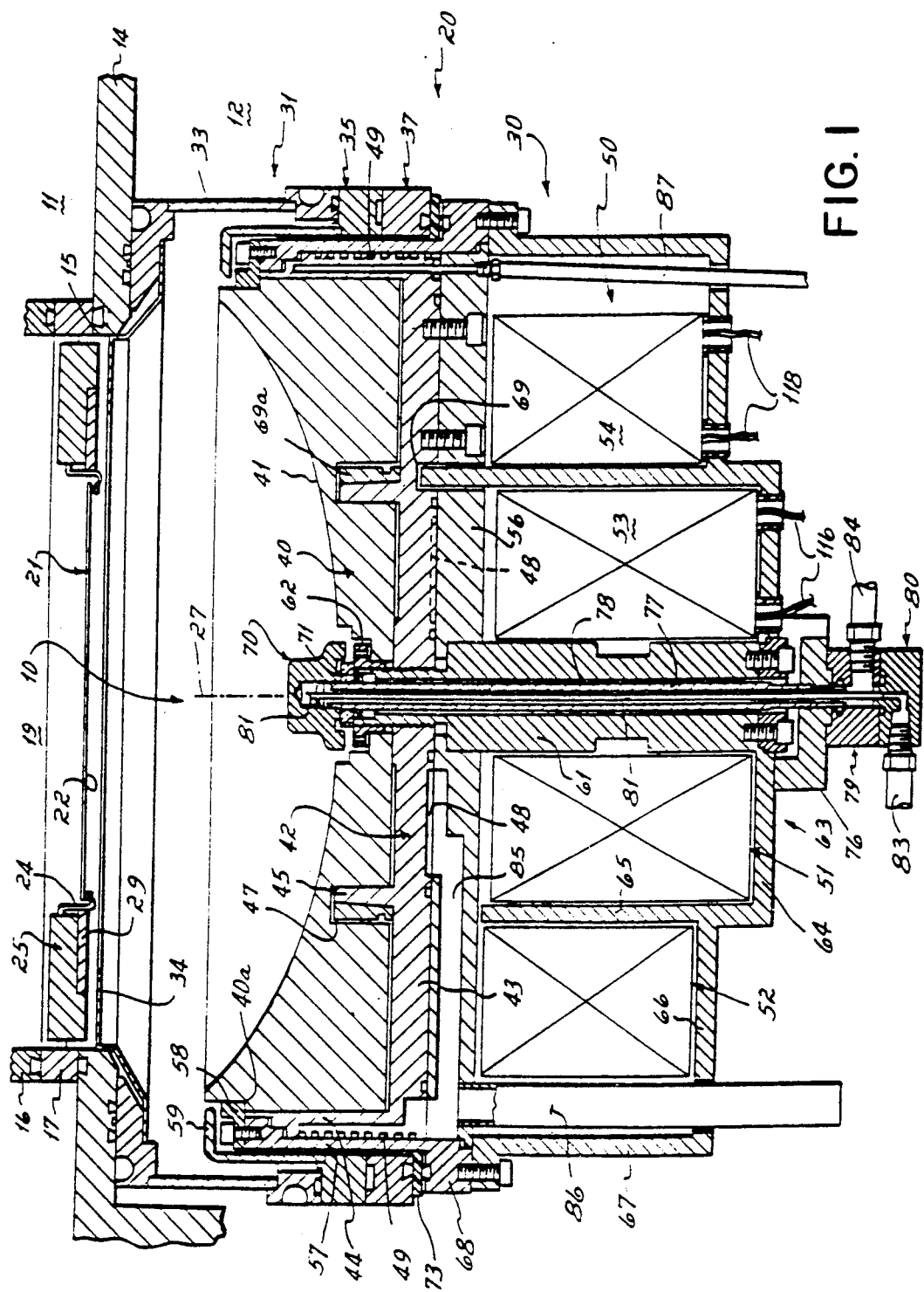
FIG. 1 is a cross sectional view illustrating one preferred form of a sputter coating chamber of a wafer processing apparatus according to principles of the present invention.

FIG. 1 illustrates, in cross-section, a sputter coating processing chamber 10 of a sputter coating apparatus according to principles of the present invention. The chamber 10 is a portion of the sputter processing apparatus disclosed in U.S. Pat. No. 4,909,695. The processing chamber 10 is a vacuum processing chamber formed of an isolated section of a main chamber 11. The main chamber 11 is isolated from the atmosphere of the machine environment 12 by a plenum wall 14. The processing chamber 10 is capable of communicating with the main chamber 11 throughout opening 15 in the plenum wall 14. The opening 15 is generally circular. The processing chamber 10 is capable of being selectively isolated from the main chamber 11 by the selective movement of a processing chamber back plane section 16 against a portion of a disk shaped rotary wafer transport member 17 clamping the transport member 17 between the backplane section 16 and the plenum wall 14 in a sealing relationship, thereby enclosing a back plane space 19 within the processing chamber 10 and isolating the processing chamber 10 from the main chamber 11.

Opposite the backplane section 16, on the front plane side of the transport member 17, the processing chamber 10 is isolated from the machine environment 12 with a cathode assembly module 20 mounted in a vacuum sealing relationship against the plenum wall 14 surrounding the opening 15. The module 20, or processing chamber frontplane section, cooperates with the backplane section 16 and the transport member 17 to form the sealed isolated processing chamber which is isolated from both TM the main chamber 11 and the machine environment 12. Within the processing chamber 10 is a workpiece 21 in the form of a flat silicon wafer or disk which has the surface 22 upon which a coating is to be deposited in a sputter coating process to be performed within the processing chamber 10. The wafer 21 is held by a set of clips or other retaining devices 24 in a wafer holder 25 resiliently carried by the transport member 17. The transport member 17 is rotatable within the main chamber to bring the holder 25, and the workpiece or wafer 21 into alignment with the hole 15 so that the processing chamber 10 can be formed around the wafer 21 on the holder 25 by transverse movement of the backplane section 16 to move the member 17 against the plenum wall 14. (The transport member portion 17 is a transversely movable ring carried by a rotatable index plate which is not shown.) In this preferred embodiment, the wafer 21 is concentric with and supported in a plane perpendicular to a central axis 27 of the main chamber 10, which is also concentric with the hole 15 in the plenum wall 14. Surrounding the wafer 21 on the holder 25 is a disk 29 which at least partially protects the holder 25 from an excessive accumulation of coating intended for but which missed, the surface 22 of the wafer 21. Details of the sputtering apparatus of which the processing chamber 10 is a part including particularly details of the wafer transport 17, wafer holder 25, and back plane section 16, are described and illustrated in the U.S. Pat. Nos. 4,909,695 and 4,915,564 incorporated by reference above.

The cathode assembly module 20 includes two assemblies, a removable cathode assembly 30 and a fixed assembly portion 31. The fixed assembly portion 31 is an annular enclosure rigidly mounted in sealed relationship against the plenum wall 14 surrounding the opening 15. It includes a cylindrical metal side wall 33 of the chamber 10 which is electrically grounded to the frame 14 of the plenum, a wafer holder shield 34 which surrounds the opening 15 and a chamber door frame assembly 35.

The cathode assembly 30 is mounted to a hinged door assembly 37 which removably but sealably supports the cathode assembly 30 to the fixed assembly 31. The cathode assembly 30 carries the sputtering target 40, which is an annular concave target having a continuous smooth concave sputtering surface 41. The assembly 30 supports the target 40 with its axis in alignment with the axis 27 of the chamber 10 and with its sputtering surface 41 facing the surface to be coated 22 of the wafer 21.

The target 40 is supported in a target holder or nest 42 having a generally circular back plate 43 concentric with the axis 27. The target holder 42 has an outer cylindrical wall 44 and an upstanding cylindrical midwall 45. The outer wall 44 surrounds the outer rim of the target 40. The target 40 has an outer cooling surface which, when the target 40 is mounted in holder 42 and expanded to operating temperature, conforms to and lies in close cooling contact with the inner surface of the holder 42. An annular groove 47 on the back of the target 40 lies in partial contact with the midwall 45 of the holder 42. The target holder or nest 42 has a plurality of annular grooves 48 in its back surface and annular grooves 49 on the outside of its outer wall 44 for the circulation of cooling liquid, which is generally water, to remove heat generated in the target 40 during sputtering by cooling the heat conductive target holder 42. The shapes of the surfaces of the target 40 are preferably such that all the target 40 is capable of being formed by turning block of sputtering material on a lathe. The target holder 42 is made of a heat conductive and electrically conductive material, preferably hard tempered OFHC copper or Alloy 110. The target 40, when operationally heated, expands and preferably plastically deforms into a shape which conforms tightly to the interior cavity of the holder 42 and thereby cooperates with the holder 42 to conduct heat thereto. The cooperation of the holder 42 and the target 40 are preferably as described in U.S. Pat. No. 4,871,433 incorporated by reference above.

The target assembly 30 is provided with a magnet assembly 50 which preferably includes a pair of concentric annular magnets 51 and 52, preferably electromagnets having annular inner and outer windings 53 and 54, respectively, lying concentrically in a plane behind the target holder 42 and centered about and perpendicular to the axis 27. A rigid ferrous material, such as Type 410 annealed stainless steel, forms the structural support of target assembly 30 and constitutes the magnetic pole pieces of the magnets 51 and 52. This ferrous material includes a circular center plate 56, which forms the planar rear support of the assembly 30 and sustains the transverse magnetic field between pole pieces of the magnets 51 and 52. A cylindrical outer pole piece 57 is welded to the plate 56 at the outer edge thereof to stand upwardly therefrom and to surround the outer wall of the holder 42. A target outer retainer ring 58, is bolted to the upper edge of the outer pole piece 57, so as to rest on an outer annular lip 40a of the target 40 to retain the target 40 in the nest 42. The upper exposed surface of the outer pole piece 57 and ring 58 is shielded by a metal dark space shield 59, which prevents sputtering of the pole piece 57 or retainer ring 58. The dark space shield 59 is rigidly secured to the chamber wall 33 and thereby electrically grounded.

An inner cylindrical pole piece 61, having as its axis the axis 27, projects through the inner rim of the target 40. This pole piece 61 is threaded through the center of the holder 42 below the target 40, and has threaded thereon, above the target 40, a center retainer nut 62 which retains the target 40 at its center hole. The center pole piece 61 has bolted to the bottom end thereof a pole cap assembly 63. The pole cap assembly 63 includes a circular inner plate 64, a cylindrical lower middle pole piece 65 welded at its base to the outer edge of the plate 64, an annular outer plate 66 welded at its inner edge to the outside of the lower middle pole piece 65, and a lower cylindrical outer pole piece 67 welded at its base to the outer edge of the annular plate 66. The lower outer pole piece 67 has bolted to its upper edge, base 68 of outer pole piece 57. The components 64, 65, 66 and 67 of the pole cap 63 have a common axis lying on the axis 27 of the chamber 10.

The middle cylindrical pole piece 65 underlies the annular groove 47 in the back of the target 40, and projects either in a continuous annular ring or at spaced intervals through the plate 56 into a recess 69 in the back surface of the holder 42. A ring 69 of rigid ferromagnetic material and having approximately the same diameter as that of the middle pole piece lies, and is embedded within, the annular groove 47 in the back surface of the target 40. The upper end of the middle pole piece 65 lies in the annular groove through the surface of the backplate 56 close to the ring 69a. The ferromagnetic ring 69 surrounds the midwall 45 of the holder 42 in the groove 47 in the back of the target 40.

The middle pole piece 65 together with the ring 69a form a pole piece which the inner and outer magnets 51 and 52 have in common. The ring 69a is magnetically coupled to the middle pole piece 65 so as to extend the effective pole piece at the annular groove 47 of the target 40 to very near, but beneath, the surface 41 of the target 40. In that the ferromagnetic ring 69a is of a rigid ferromagnetic material, it is substantially stronger structurally than the soft copper of the holder 42 and is made of a material which expands less when heated. As such, it serves to structurally reinforce the midwall 45 of the target holder 42 against radial expansion caused by the heating of the target 40, thereby also restraining the target 40 against radial thermal expansion.

Concentrically mounted at the top of the center pole piece 61 is a central electrode 70, electrically insulated from the pole piece 61 by a ceramic washer 71. The center pole piece 61, the target 40, the holder 42 and the entire center plate 56 and pole cap assembly 63 are energized to the same cathode potential. Accordingly, the assembly 30 is insulted from the grounded fixed assembly 31 by a Teflon insulated annular spacer 73.

A center pole cap 76 is fixed to the bottom of the pole cap assembly 63, concentric with the axis 27. The cap assembly 63 supports an outer cooling fluid tube 77 which extends vertically through a bore 78 in the central pole piece 61 to the electrode 70 with which it makes electrical contact. The tube 77 is electrically conductive and insulated from the cap 76 to provide for the energizing of the electrode 70 at a potential which is different from the target 40 or the grounded chamber wall 33. Mounted to the bottom of the cap 76 is an outlet tube assembly 79 for transmitting cooling fluid from the tube 77. An inlet assembly 80, connected to the base of the outlet assembly 79 supports an inlet tube 81 which extends through the center of the tube 77 to the electrode 70 to supply cooling fluid thereto. A water inlet 83 and outlet 84 are provided in the inlet assembly 80 and outlet assembly 79 respectively. Similarly, cooling passages 85 are provided in the plate 56 for communicating cooling water from passages 48 and 49 to a cooling water outlet 86 in the plate 56. A cooling water inlet 87 communicates water through a grinder inlet duct to the passages 48 and 49 in the holder 42.

Figure 2:
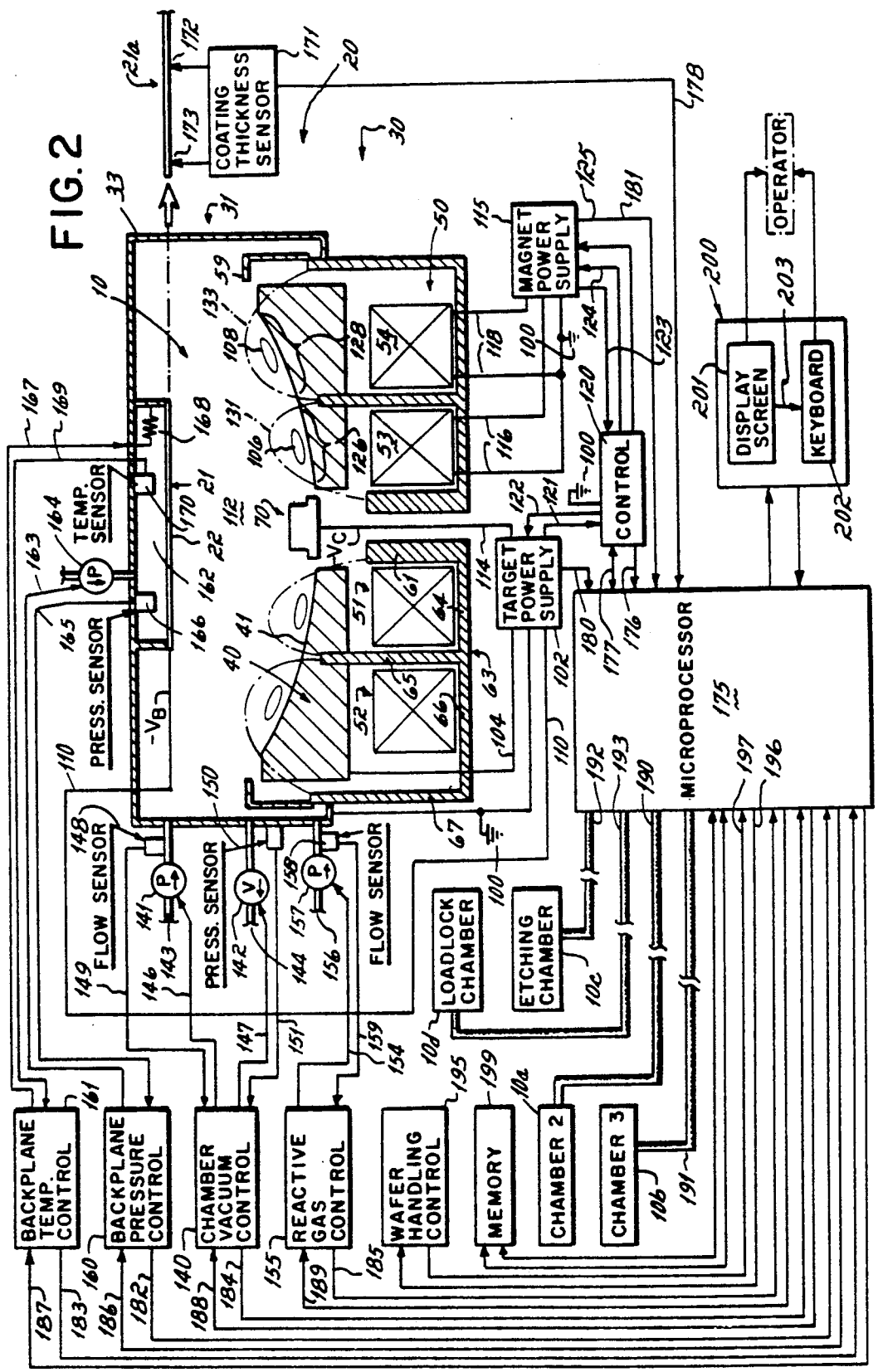
FIG. 2 is a diagrammatic view of the apparatus of FIG. 1. including particularly the controls therefor.

The electrical circuitry of the sputter processing portion of the apparatus is illustrated in the diagram of FIG. 2 which shows the sputtering chamber 10 with its wall 33 maintained electrically at ground potential through a system ground connection 100. A target power supply 102 supplies energy at a negative potential of, typically, several hundred volts through conductor 104 to the target 40. This voltage results in a flow of current manifested in part as a flow of electrons from the surface 41 of the target 40 into a one or more plasmas 106, 108 maintained over the target surface 41 and by an ion flux from the plasmas 106, 108 onto the surface 41 of the target 40. The plasmas 106, 108 are ionized clouds of the chamber gas formed as electrons collide with the gas atoms stripping other electrons from them.

The wafer 21 is connected so as to be maintained closer to ground potential but, for bias sputtering, is biased so as to be substantially negative relative to ground in the range of from 50 to 100 negative volts, $-100$ volts in the illustrated example. The bias potential is supplied through a conductor represented as line 110 from the power supply 102. A current in the circuit through line 110 is a resultant, in part, of an emission of a small quantity of electrons from the surface 22 of the wafer 21 and a secondary flow of ions onto the surface 22 from a space 112 near the surface 22. The secondary ions are the result of collisions of the electrons emitted from the wafer 21 with gas in the space 112. The current may also result, in part, from electrons and ions striking the surface 22 of the wafer 21 from the regions of the plasmas 106 and 108.

The power supply 102 also is provided with an output 114 for applying a potential to the central electrode 70. This potential is preferably a negative potential of from $-0$ volts to $-20$ volts or greater in magnitude. Current through line 114 is a result, in part, of electrons flowing onto the electrode 70 which stray from the more negatively charged target 40 and plasmas 106, 108 to which they return through the conductor 104, completing the circuit. This current is believed, however, to be more largely the result of ions attracted to the electrode 70 from the plasmas 106, 108. Typically, this current is in the range of from 10 to 100 milliamps. Similarly, some currents flow in circuits through the conductors 104, 110 and 114 via the system ground 100 as a result of electrons and ions striking the chamber wall 33, the dark space shield 59 and other grounded components of the chamber 10.

Also provided are one or more magnet power supplies 115 for activating the magnet windings 53 and 54 by supplying current to them through leads 116, 118 respectively, and control circuitry 120 for controlling the operation of the power supplies 102 and 115 with control signals supplied through signal lines represented as 122 and 124, 125 respectively in FIG. 2. Feedback lines 121 and 123 respectively feed back the values of actual electrical parameters from the power supplies 102 and 115, respectively, to the control 120. The circuits 115 and 120 also have grounds connected to the system ground 100.

Figure 3:
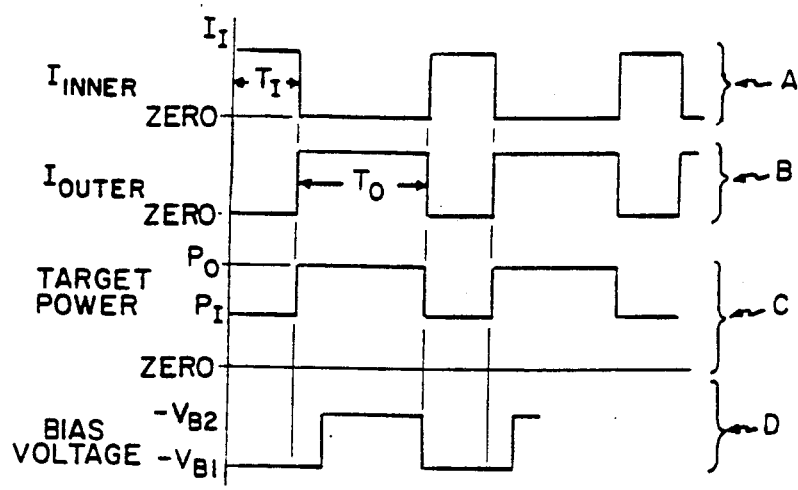
FIG. 3 is a graph illustrating certain electrical signals of the control of FIG. 2.

In the preferred embodiment of the invention, only one of the plasmas 106, 108 is energized at a time. This is achieved by switching the current to the magnet windings 53, 54 on and off alternately with signals from the controller 120 through line 124 to the magnet power supply 115. The currents to the magnet windings 53, 54 are switched to different current levels $I_T$, $I_O$ and for differing "ON"-time $T_I$ and $T_O$ as represented by the graphs A and B of FIG. 3. This causes the sputtering to alternate between two respective annular regions 126, 128 of the surface 41 of the target 40 underling the respective plasma rings 106, 108. In synchronization with this switching, the power level of the target 40 is switched between two levels, $P_I$, $P_O$, as illustrated in graph C of FIG. 3 so that the power is separately maintained during sputtering from the respective inner and outer target regions 126, 128. The control of the switching of the power level at the output 104 of power supply 102 is maintained by a signal on control line 122 from controller 120. In synchronism with the switching of the magnets, the bias voltage on the substrate is also switched between two levels $V_{B1}$ and $V_{B2}$ as illustrated in graph D of FIG. 3.

In the performance of a sputter coating operation in a sputtering chamber 10, it is usually desired that electrons emitted from the surface 41 of the target 40 be trapped and remain entrapped in the plasmas 106, 108. The provision of the magnets 51, 52 generate, when their coils 53, 54 are energized, magnetic fields 131, 133 which form arched closed loop magnetic tunnels in the shape of annular rings on the target surface 41 as determined by the placement of the concentric pole pieces 61, 65 and 67. This applies to structures, such as in the embodiment shown herein and more particularly described in U.S. Pat. No. 4,957,605 incorporated above.

Referring further to FIG. 2, the processing chamber 10 is provided with a chamber vacuum control 140 which may include a pump 141 and/or valve 142 connected in inlet and/or outlet lines 143 and 144 of the chamber 10. The pump 141 and valve 142 are responsive to control signals on lines 146 and 147, respectively, from the control 140. The vacuum control also is provided with a gas flow sensor 148 connected in inlet line 143 to deliver a gas flow signal on line 149 to the control 140, and a chamber pressure sensor 150 mounted in the wall 33 of the chamber 10 to deliver a chamber pressure signal on line 151 to the control 140. Similarly, a reactive gas control 155 is provided for delivering a control signal on line 154 to a reactive gas flow control device such as a pump 157 in an inlet 156 of the chamber 10. The control 155 is responsive to a reactive gas flow sensor 158 provided in the inlet 156 which delivers to the control 155 a signal on an input line 159.

Additional controls such as a backplane pressure control 160 and a backplane temperature control 161 are provided for the chamber 10 to control the pressure and temperature of the gas at the backplane behind the wafer 21 in the chamber 10, in a space which is isolated from the space 162 of the chamber 10. The pressure control 160 has an output 163 on which a signal is delivered to a pump or valve 164 communicating with the backplane space 162, and has an input line 165 which connects to a pressure sensor 166 in the backplane space 162. Similarly, the backplane temperature control 161 has an output 167 on which a signal is delivered to a heater 168 communicating with the backplane space 162, and has an input line 169 which connects to a temperature sensor 170 in the backplane space 162.

In addition, a coating thickness sensor 171 is provided located either in the chamber 10 or, preferably, outside of the processing chamber 10 so as to measure the coating thickness at various points, such as inner point 172 and outer point 173, on a wafer such as wafer 21a, which has been processed within the chamber 10 and has been removed therefrom.

A microprocessor 175 is provided having, for each of the processing chambers of the machine, a data and control cable 176 connected to the control 120 to deliver control signals thereto, and with a data input cable 177 connected to the control 120 to receive monitoring signals therefrom. Inlet line 178 is also provided to deliver to the microprocessor 175 a signal from the thickness sensor 171. The microprocessor 175 has other monitoring data input cables including cable 180 from the target power supply 102, cable 181 from the magnet power supply 115, cable 182 from the backplane pressure control 160, cable 183 from the backplane temperature control 161, cable 184 from the chamber vacuum control 140, and cable 185 from the reactive gas control 155. Control signal lines 186-189 are also provided from the microprocessor 175 to the controls 160, 161, 140 and 155, respectively, to deliver control signals thereto.

Similar sets 190-193 of cables connect the microprocessor 175 with other sputter processing chambers 10a and 10b of the machine, with an etching chamber 10c of the machine, and with a loadlock chamber 10d of the machine, as described in connection with FIG. 4 below. The mechanical movements of the machine, including the wafer moving mechanisms represented in FIG. 2 as wafer handler control 195, are also explained in connection with FIG. 4 below. The control 195 is also provided with a control cable 196 from the microprocessor 175 and a monitoring cable 197 to the microprocessor 175.

The microprocessor 175 controls and monitors the machine functions described above and, in addition, in accordance with a program and data stored in a memory 199 connected to the microprocessor 175, displays information on, and accepts information entered by, an operator interface station 200 which includes a display screen 201 and a data entry keyboard 202. The interface station 200 may include a data path 203, or the program within the microprocessor 175 may provide, for automatic or programmed entry of data or commands, in lieu of data entered by an operator via keyboard 202, in response to data measured, computed, preset or programmed. Preferably, however, at least some of the control of the machine is in response to data or commands entered on the keyboard 202 by a human operator in response to information displayed on the display 201.

Figure 4:
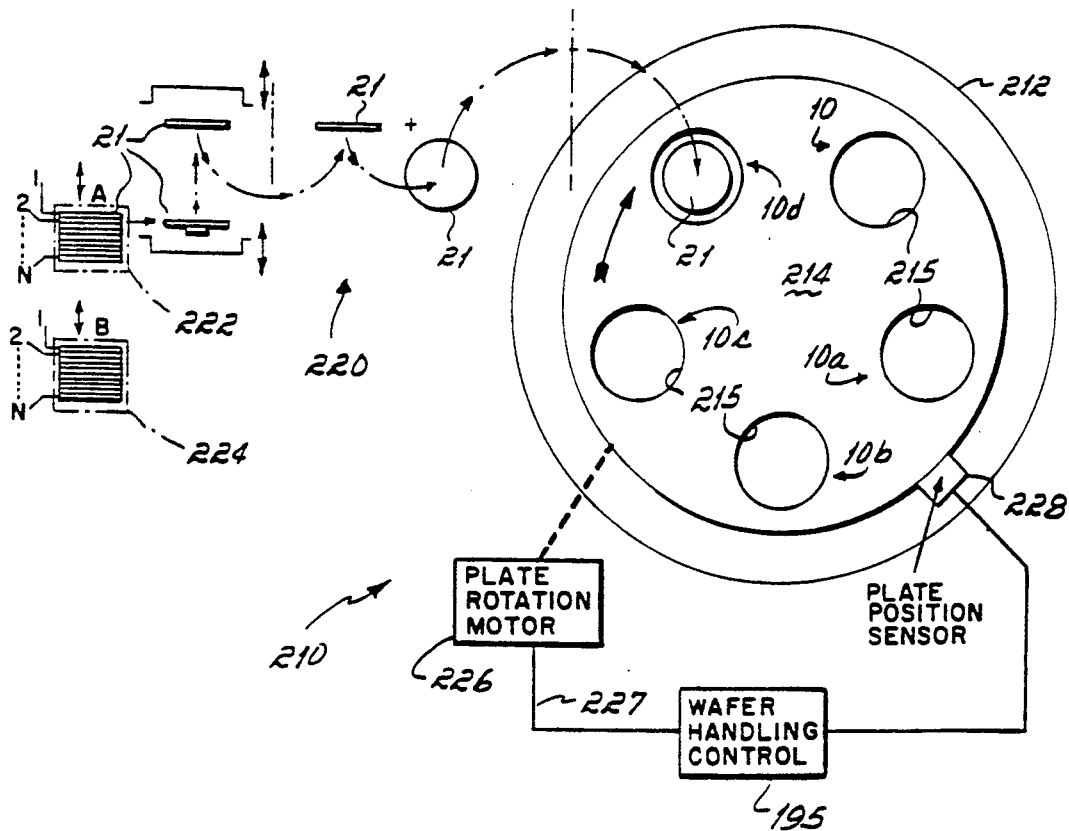
FIG. 4 is a diagrammatic view of the apparatus of FIG. 2 including particularly the wafer handling features thereof.

The wafer handling controls 195 of the wafer processing machine 210 are diagrammatically illustrated in FIG. 4, which represents a machine such as described in U.S. Pat. Nos. 4,909,695 and 4,915,564 incorporated by reference above. The machine 210 includes a main vacuum chamber 212 having rotatably mounted therein an index plate 214 with five wafer holders 215 equally spaced at angular positions therearound. The chamber 212 includes five stations spaced in a circle so that one of the holders 215 is positioned in each of the stations. Each of the stations has positioned thereat one of the chambers including the processing chambers 10, 10a and 10b, the etching chamber 10c, and the loadlock chamber 10d through which wafers are transported into and out of the machine 210, and between the machine 210 and a pair of wafer holding cassettes 222 and 224, by a transfer mechanism 220. The machine 210 has one or more control lines, such as line 227 from control 195 to the plate rotation motor 226, for receiving control signals from the control 195 and one or more machine position or condition sensors, such as plate position sensor 228 for receiving information from the machine 210.

Referring again to FIG. 2, the control 120 in combination with the microprocessor 175 and interface 200 provides both automatic and operator assisted control of the wafer processing machine and the processes performed thereby. It includes, in the interface module 200 which, operated under control of the PC based microprocessor 175, displays information to the operator on the screen or display 201, primarily in menu form, and accepts instructions or option selections from the operator entered through the keyboard 202. The keyboard 202 is provided with data entry keys and, in addition, function keys, the operations of which change with the menus displayed on the screen 201. The functions of the function keys are defined for the operator by labels displayed on the viewing screen.

Preferably, the control of the machine includes response to manual, operator performed, decision making steps in the implementation of changes in operating parameters of the processes of the machine 210. Preferably also, control of the machine is made in response to the measurements of the ultimate performance of the machine or result of the process, rather on any attempt to measure, estimate, compute or otherwise quantify target erosion or other equipment parameter or condition. Furthermore, while control of some of the parameters of the machine or process may include some real-time, continuous, in-line, closed-loop control, fully automatic control of the parameters of the machine to imprecisely or crudely compensate separately for individual effects of factors such as target erosion, as with devices of the prior art, is avoided. Instead, it is preferred that the control 120 employ a very tight open-loop control of the machine 210, to make operating parameter adjustments in response to precise measurements on the processed wafers. As such, an optimum balance is achieved between limitations in the capabilities of available state of the art measurement and control devices and intermittent manual parameter adjustment based on the experience and analytical ability of a user with the aid of the monitoring and calculating functions available to the operator through the interface 200.

The target and cathode assembly 30 with which the control and interface of the present invention is preferably used is energized in the manner described in the above incorporated U.S. Pat. No. 4,957,605. It employs the one piece annular concave target 40 with two concentric circular plasmas 106 and 108, energized by alternately switching magnet and target power supplies. The cathode assembly 30 employs the two concentric circular electromagnets 51 and 52, the currents which are supplied from the separate power supply outputs 116 and 118 controlled such that when one magnet is on the other is off. The target 40 is energized by the target power supply 102 which is switched between different levels in synchronism with the switching of the magnet currents. A control 120 controls the magnet currents and target DC power in accordance with programmed values or established setpoints entered under the control of the microprocessor 175 through the interface module 200. The microprocess 175 operates in accordance with a program which controls commands to the control 120, processes measured monitoring data from the machine, and exchanges information with the user through the interface 200.

The interface 200 operates to exchange data with the operator in either a SET-UP mode or two operating modes, which include a STANDARD mode and a CALCULATING mode.

In the SET-UP mode, values such as the maximum and minimum current limits for the outer and inner coils are entered, and other such more or less fixed parameters. In addition, a stored value for the target material limit, or maximum target power, is entered by the operator from a SET-UP screen (not shown) when a target is installed. This limit is taken into account in calculating the suggested parameter values.

In the STANDARD operating mode, the user enters initial values for the outer and inner magnet current settings, the outer and inner target power settings, the process time, and the duty cycle (defined as the portion of total time that the outer magnet and high power levels are on). Other parameters also entered by the operator in the STANDARD mode include backplane temperature, sputtering power delay, bias voltage delay, load-lock chamber pump-out time, the starting vacuum level and argon gas flow rate. The operator has the opportunity of entering the revised settings or other data in response to measurements of the coatings on test wafers.

In the CALCULATING mode, the operator manually enters through the keyboard the parameters which would be entered under the STANDARD mode and, in addition may enter the desired deposition thickness, the desired deposition rate, the measured outer wafer coating thickness, the measured inner wafer coating thickness, the number of kilowatt-hours of energy used by the target. All of the above values are preferably manually entered by the operator. However, certain values, such as the measured values may be obtained from in-line sensors or other methods and automatically entered.

The measured thickness of the coating is preferably obtained by measurements made on test wafers such as those processed in special qualifying runs on the machine, in which wafers are subjected each to a single process in a single processing chamber of the machine. The capability of entering such measurements manually by the operator with instruments separate from the machine, either in lieu of or in addition to automatic feedback of in-line measurements, provides greater accuracy and flexibility.

The target energy consumed is determined by the operator by any method practical. This energy value, in kilowatt hours, is entered for information purposes in that it is sometimes used as a rough indication of target age or the state of target erosion. With the control of the present invention, however, neither target age or target erosion are needed for operating parameter control.

Desired coating thickness, desired deposition rate, measured inner and outer coating thicknesses and programmed inner and outer target power, are used as a basis for calculating suggested alternative settings for the parameters of outer and inner target power, process time and duty cycle.

The calculated values of inner and outer target power, duty cycle and process time are preferably suggested values which are displayed to aid the operator in deciding what parameters to enter. The operator then may manually enter the suggested values, ignore them, reuse the existing values or change any parameters by entry of any value within the range of values acceptable by the program. In its preferred form, the system employs an operator interface with monitoring features, enhanced with a calculation capability, and displays which provides the operator with information regarding actual parameter values and parameter settings, and accepts data and control commands from the machine operator.

While in certain applications, the use of data from measurements of some actual operating parameters of the machine is contemplated, the preferred control and interface reuses the programmed parameter settings until they are specifically changed by the operator. The use of measured data from prior depositions is preferably at the express election of the operator.

In the CALCULATING mode, the making of adjustments based on measured data from prior depositions avoids the need to make specific corrections to parameters to compensate for rate roll-off due to target erosion or for variations due to differences in target material. The computer will adjust the parameters to control the relative sputtering rates from the inner and outer target regions to avoid the effects of target erosion and to maintain a constant deposition ratio of material sputtered from the inner and outer regions onto the substrate.

The interface 200, under control of the microprocessor 175, displays certain information to the operator, primarily in menu form, and accepts certain instructions or option selections by the operator through function keys. The operation of most function keys change with the menus and are defined for the operator by labels displayed on the viewing screen as illustrated in FIGS. 5A through 5I. The MAIN and PREVIOUS function keys exist independently of those displayed on the screen and can be used at any time.

Figure 5A:
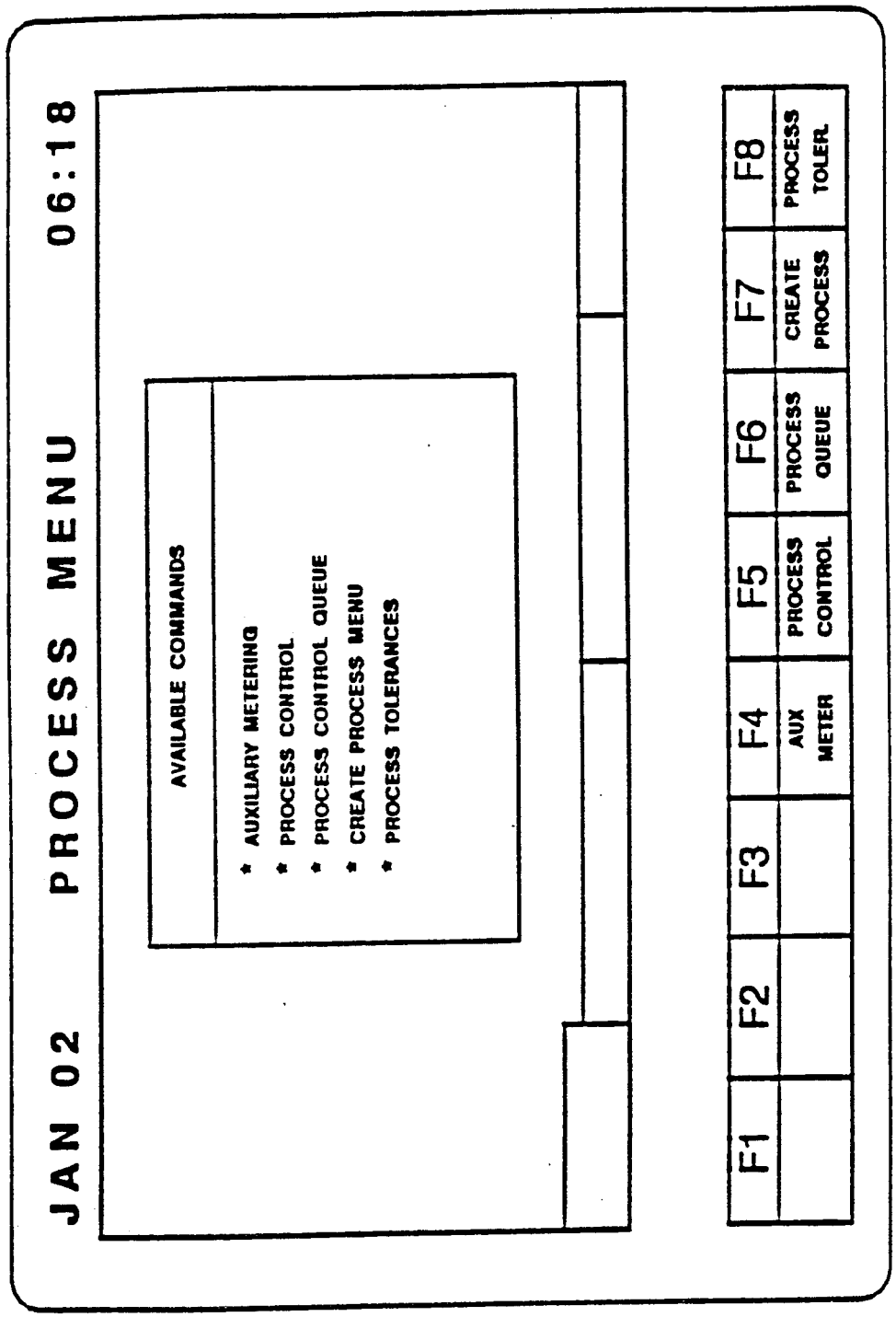
FIG. 5A is an illustration of the Main menu display of the interface of FIG. 5.

Referring to FIG. 5, the control interface 200 operates, when the machine 210 is first energized and the control program is started, to display on the screen 201 a prompt for the entry of a user ID. When an authorized code is entered on the keyboard 202 and accepted by program, a MAIN menu is displayed. This allows the operator to select the PROCESS menu, which is illustrated in FIG. 5A.

From the PROCESS menu, the operator may select any one of five functions. These are: AUXILIARY METERING, PROCESS CONTROL, PROCESS QUEUE, CREATE PROCESS, and PROCESS TOLERANCES. Each of the functions, when called, displays a corresponding menu from which submenus or other functions may be selected. From each menu or submenu, the user may exit back to the menu from which that menu or submenu was called via use of the PREVIOUS function key. From the main menu, the user may enter a SET-UP menu if so authorized.

The AUXILIARY METERING menu is illustrated in FIG. 5B. This menu is purely a monitoring screen. With it the operator can view actual parameters measured by sensors in the apparatus.

The PROCESS CONTROL menu is illustrated in FIG. 5C. From the PROCESS CONTROL menu, the procedures used for the processing of wafers are executed. Before any process can be executed, the process must be defined from the CREATE PROCESS menu.

Figure 5D:
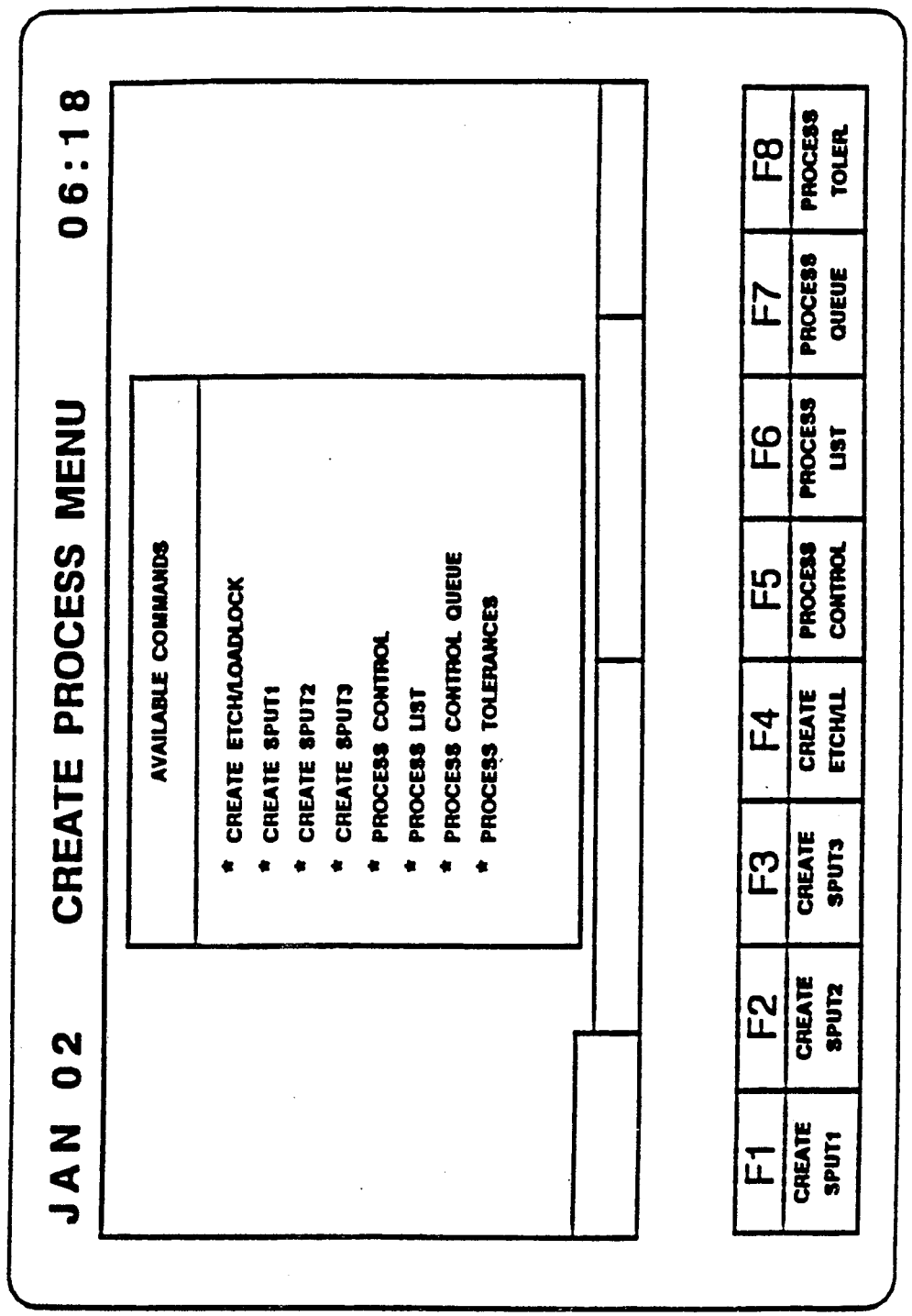
FIG. 5D is an illustration of the Create Process menu display of the interface of FIG. 5.

The CREATE PROCESS menu is illustrated in FIG. 5D. From the CREATE PROCESS submenus, process parameters are defined for each unique process. For each process, a Process ID is established and the parameters for that process are stored on a system hard disk within the interface 200 while in the CREATE PROCESS menu and submenus. Once defined and stored, the stored processes are recalled from the hard disk for use or reference. FIGS. 5E, 5F and 5G are submenus of the CREATE PROCESS menu which are described below.

The PROCESS TOLERANCES menu is illustrated in FIG. 5H. From the PROCESS TOLERANCES menu, standard process parameter tolerances may be altered and stored before the process is run.

For a purpose to run, it must be queued. This is done from the PROCESS QUEUE menu which is illustrated in FIG. 5I. From the PROCESS QUEUE menu, the Process ID, an associated Batch ID Number, and the Number of Cassettes to receive that process are entered. Then, use of an ADD function key queues the process to be run.

The functions selectable from the PROCESS menu (FIG. 5a), when selected, present the operator with a corresponding menu appropriate for the selected function. Each of these menus provides the operator with functions from the menu selections available, as set forth in detail under each below.

Referring to FIG. 5B, from the AUXILIARY METERING menu, the monitoring is provided of actual parameters of the system measured by sensors in the apparatus. The parameters are displayed separately for each processing chamber of the machine. The parameters which are displayed differ depending on the set up of the particular processing chamber. With the machine herein described, three chambers are set-up for sputter coating operations, either with a two-plasma single-piece target or a single plasma target. One chamber is configured for sputter etching, and one chamber is configured as a loadlock chamber through which wafers pass into and out of the main chamber (FIG. 4 above).

With a single-plasma target rather than a two-plasma target, the AUXILIARY menu displays variables defined as follows:

POD: The chamber ID reflecting the type or process being carried out in each of the four processing chambers. These are designated Etch, Sput1, Sput2 and Sput3.

WAFER PRESSURE: Actual backside gas pressure being measured during the process for the respective chamber (in Torr).

With a control for use in machines equipped with the two plasma SuperStep cathode, in addition to the WAFER PRESSURE, displayed respectively next to each POD in a table are the following parameters:

IN POWER: Actual power level of the target, measured when the inner plasma is activated (in KW).

OUT POWER: Actual power level of the target, measured when the outer plasma is activated (in KW).

IN HIGH COIL AMP: Actual upper current level for the inner coil (in Amps).

IN LOW COIL AMP: Actual low current level for the inner coil (in Amps).

OUT HIGH COIL AMP: Actual upper current level for the outer coil (in Amps).

OUT LOW COIL AMP: Actual low current level for the outer coil (in Amps).

From the AUXILIARY METERING menu, the only functions available to the operator are to proceed to one of the other menus available from the PROCESS menu by selection of the corresponding function key (that is, PROCESS CONTROL, PROCESS QUEUE, CREATE PROCESS or PROCESS TOLERANCES). The two function keys, MAIN and PREVIOUS, are permanent keys that select the MAIN menu, and the previous menu. In this case, the previous menu would be the PROCESS menu.

Referring to FIG. 5C, from the PROCESS CONTROL menu, the procedures used for the processing of wafers are executed. Before any process can be executed, the process must have been defined from the CREATE PROCESS menu. From the CREATE PROCESS menu, the Process ID will first have been established and the parameters corresponding to the identified process for each of the machine processing chambers will be set by the entry of data and the selection of programming options by the operator. From the CREATE PROCESS menu and submenus, parameter changes in the process will also have been made by the operator. When the process was created or changed, the process will have been stored on the system hard disk from which it can be recalled when the process is run. In addition, standard process parameter tolerances will have been set and stored, before the process is run, from the PROCESS TOLERANCES menu.

To run processes, they will also have been first queued by entering from the PROCESS QUEUE menu the Process ID information, an associated Batch ID Number, and the Number of Cassettes to receive that process. Then, from the PROCESS CONTROL menu, functions available to the operator may be selected by the depression of a function key. These functions are:

START: The START function starts the first queued process which will have been displayed on the PROCESS QUEUE screen when the process was queued.

QUALIFY: The QUALIFY function is a test procedure which cycles four wafers into the system, one to each process chamber, simultaneously processes each wafer in accordance with a specified process for the chamber, and then cycles all four wafers out of the system. Where a 2-pass optional process is specified for any chamber, the QUALIFY function executes only the process specified in the first pass.

STOP: The STOP function stops the processes from running.

EMPTY SYSTEM: The EMPTY SYSTEM function returns unprocessed or partially processed wafers to the cassette.

PARTICULATE TEST: The PARTICULATE TEST function is used primarily for loadlock particulate testing. This function cycles wafers into the loadlock, pumps the loadlock down to a vacuum level, vents the loadlock back to the external atmosphere and returns the wafers to the cassette.

From the PROCESS CONTROL screen, the operator may, by selection of the corresponding function key, proceed to the PROCESS QUEUE menu, the CREATE PROCESS menu or PROCESS TOLERANCES menu, or return to the MAIN or PROCESS (previous) menu.

As a process is being run or some other function is being executed from the PROCESS CONTROL menu, real time monitoring of parameters takes place, during which values are updated every second and displayed on the screen. In addition, wafer tracking of the location of each wafer as it travels through the system is provided. From the PROCESS CONTROL screen, monitored data is displayed adjacent the POD identification for each chamber. The data displayed includes the following:

CASSETTE A/B: The location of each wafer, according to a number associated with its original position in the cassette. The two columns correspond to each of two cassettes A and B.

TEMP: The actual temperature of the backplane for Etch, Sput1, Sput2, Sput3 chambers, and of the frontplane for the Loadlock (in C°).

ETCH: The actual DC off-set voltage due to an RF excitation on the etch backplane and wafer holder is displayed for the Etch process chamber (in Volts).

SPUT: The actual power (in KW) being applied to the DC magnetron cathode (the two plasma cathode where in use), or the DC offset voltage (in Volts) being applied to an RF diode target (where in use).

BIAS: The actual DC off-set voltage due to an RF excitation applied to the wafer during single plasma DC sputtering.

ARGON: The actual argon flow rate (in SCCM).

PRESSURE: The high vacuum status and actual process gas pressure (in Torr). This column's display is dependent upon whether the chamber is in a high vacuum state or if a process gas is active.

REGAS: Actual reactive gas flow (for those chambers so configured) for the first and second gasses.

Referring to FIG. 5D, the CREATE PROCESS menu allows access to additional screens or submenus provided for the creation and execution of process functions. These screens are CREATE SPUT1, CREATE SPUT2 and CREATE SPUT3 for the three sputter coating chambers, CREATE ETCH/LOADLOCK for the etch and loadlock chambers, and PROCESS LIST to display a list of the created processes available to be queued and run. The CREATE PROCESS SPUT1, CREATE PROCESS SPUT2, AND CREATE PROCESS SPUT3 menus are, except for the chamber to which they relate, identical and are referred to generically below as the CREATE PROCESS SPUT menus. These menus have two versions, one for reactive gas and pulse processes and referred to below as the CREATE PROCESS SPUT (REGAS/PULSE) submenu, and one for two plasma target processes referred to below as the CREATE PROCESS SPUT (DUAL PLASMA) submenu.

In addition, from the CREATE PROCESS screen, the operator may proceed to the PROCESS CONTROL, PROCESS QUEUE, or PROCESS TOLERANCES screens, or to return to the MAIN or previous (PROCESS) menu.

The CREATE PROCESS SPUT (DUAL PLASMA) submenu and the CALCULATE PROCESS submenu, which is accessible only from each of the CREATE PROCESS SPUT (DUAL PLASMA) screens, are the options for programming processes in the two plasma target sputtering chambers with the control in its standard mode or, alternatively, in its calculating mode.

Referring to FIG. 5E, the CREATE PROCESS SPUT (DUAL PLASMA) submenus are those from which the operator can select the functions for defining and programming the processes for the respective chambers equipped with the two plasma control.

From the CREATE PROCESS SPUT (DUAL PLASMA) screen, the operator may begin to create a new process, or may add or modify or delete the parameters of any previously created process. Creating a process is a matter of establishing a Process ID and then proceeding with the entry of new data or changed data for process parameters. The Process ID, along with its parameters and parameter tolerances, are stored on the system hard disk for future use or reference. All processes must be stored before being run.

Once a process is identified in the selected processing chamber, in addition to entering and changing the parameters, other functions are selectable from the CREATE PROCESS SPUT (DUAL PLASMA) screens. These are the following:

LOAD PROCESS: The LOAD PROCESS function retrieves process parameters from memory to the screen for an identified existing process.

SAVE PROCESS: The SAVE PROCESS function saves process parameters from the screen to memory for the identified process.

DELETE PROCESS: The DELETE PROCESS function deletes process parameters from memory for an identified process.

PASS 2: The PASS 2 option generates a second screen for the creation of a two-pass process for the identified process.

CALCULATE PROCESS: The CALCULATE PROCESS function accesses the CALCULATE PROCESS submenu which enters the alternative CALCULATING mode.

In addition, by selection of the appropriate function key, the operator can transfer to any of the other CREATE PROCESS SPUT1, SPUT2, SPUT3 and ETCH/LOADLOCK submenus.

In creating a process, the operator enters a Process ID. All processes, including production runs and target preparation runs or "burn-ins", are run from parameters stored on a hard disk. These parameters are stored with a Process ID which identifies the process. Upon the operator's entry of any CREATE PROCESS screen, a Process ID is typed in the Process ID field. If the LOAD PROCESS function key is pressed and the entered Process ID exists on the disk, the system displays the process parameter values stored for that process. If the process does not exist, the operator is advised of such condition. If it does not exist, the operator can enter a description of up to 20 characters to describe the process (optional), and then input parameter values into each of the fields. User ID provided at sign-in and date and time information from the free running clock-calendar are automatically stored with each creation or modification of a program. The parameter values which the operator enters when the process is defined include Fixed Parameters and Step Parameters.

The Fixed Parameters entered by the operator at the time of creation or modification of a process are those parameters that are either associated with the start of a process, or are of such a nature that they would not change during different steps of a process. The Fixed Parameters so entered by the operator for the identified process include:

BP TEMP: The required temperature of the backplane (in C° from 100° C. to 500° C.).

SPUT DELAY: The programmed time between argon gas stabilization and the application of sputtering power for the first process step in the chamber (in Seconds from 0 sec to 99).

BIAS DELAY: The programmed time between the sputtering power stabilization and the application of bias voltage for the first process step in the chamber (in Seconds from 0 to 5 seconds).

PUMP OUT: The programmed time between the process shutdown following the last step and the unsealing of the process chamber.

VACUUM: The starting high vacuum required before process runs (in Torr from $9.9 \times 10^{-6}$ to $1.0 \times 10^{-8}$ Torr).

DUTY CYCLE: The programmed or set specified ratio of the ON-time or portions of the cycle during which the outer coil and inner coil are activated. The value is defined as the programmed percentage of the entire cycle during which the outer coil is to be activated where the cycle is defined as the sum of the inner and outer coil ON-time for a cycle.

The Step Parameters entered by the operator at the time of creation or modification of a process are those parameters that are nonetheless fixed for each step process, but which are programmed at different values for up to three different steps of the process so as to provide up to three sequential steps for the process. Step Functions may be special wafer temperature or deposition rate profiles or such other parameters as are required to be different during different steps of a process. The step parameters so entered by the operator for the selected step of the identified process are the following:

OUTER POWER: The programmed outer sputtering power of the dual plasma target (in KW).

INNER POWER: The programmed inner sputtering power of the dual plasma target (in KW).

TIME: The programmed process time (in Seconds from 1 to 300 seconds).

ARGON: The programmed argon flow rate for the process (in SCCM from 40 to 150).

BP GAS: A boolean number or switch, input as Y (for Yes) or N (for No), indicating respectively, gas flow or thermal contact between the sputtering backplane and the wafer.

The deposition rate (DEP RATE) and THICKNESS are entered from the CALCULATE menu and are displayed in display-only fields on this menu. DEP RATE is displayed in Angstrom units per Second and THICKNESS is displayed in Microns.

The process parameter values input by the operator are first checked against a set of Absolute System Bounds. If the parameter value is not within these bounds, the entry of the parameter is rejected. If within the Absolute System Bounds, the parameter is then checked against the Target Material Limits for the specific target in the process station being programmed. This information will have been previously entered when the target was installed by way of a TARGET CHANGE screen (not shown). These limits prevent excessive power from being applied to the target. Values input by the operator which exceed Absolute System Bounds are not accepted by the system. Those which exceed the Target Material Limits are accepted but with the signalling of a warning to the operator.

An operator has the option of exiting any function at any time. Upon exit, if the information entered has not been stored, the operator is prompted for a "Yes" or "No" response to the question of whether exit without storing is intended.

From the CREATE PROCESS SPUT (DUAL PLASMA) screen, the operator may execute function keys for any of the functions of LOAD PROCESS, SAVE PROCESS, DELETE PROCESS or PASS 2 described above, may transfer to the other CREATE PROCESS SPUT or ETCH/LOADLOCK screens, or to a CALCULATE PROCESS submenu.

Referring to FIG. 5F, the CALCULATE PROCESS screens are supplements to the use of the CREATE PROCESS SPUT (DUAL PLASMA) screens. They are identical for each of the Sput1, Sput2 or Sput3 process chambers. The CALCULATE PROCESS screen is used to provide baseline process parameters to be used by the operator in creating or programming a two plasma process.

The purpose of the CALCULATE PROCESS screen is to provide or suggest new process parameters in response to changing measured or input data. The CALCULATE PROCESS screen displays three groups of parameters for the process being programmed. These groups are Empirical Values, Process Values and Derived or Calculated Values.

Empirical Values are machine parameters and measured results of the last run and are entered by the operator. They consist of the four programmed values defined above of DUTY CYCLE, OUTER POWER, INNER POWER, and process TIME, plus the two operator measured values of MEASURED THICKNESS OUTER and MEASURED THICKNESS INNER. KILOWATT HOURS is a display-only field. These are defined as the following:

DUTY CYCLE: The programmed or set specified ratio of the on-time or portions of the cycle during which the outer coil and inner coil are activated (same as the Fixed Parameter above).

OUTER POWER: The programmed outer sputtering power of the dual plasma target for the process step (same as the Step Parameter above; in KW).

INNER POWER: The programmed inner sputtering power of the dual plasma target for the process step (same as the Step Parameter above; in KW).

TIME: The programmed process time for the process step (same as the Step Parameter above; in Seconds, 1 to 300 seconds).

MEASURED THICKNESS OUTER: The thickness of the coating entered by the operator after measurement on an outer portion of a wafer (in Microns).

MEASURED THICKNESS INNER: The thickness of the coating entered by the operator after measurement on an inner portion of a wafer (in Microns).

KILOWATT HOURS: The total energy thus far consumed by the target as calculated by the computer (in KW hours). This value cannot be changed by the operator.

Process Values are entered by the operator. They consist of the two programmed values defined above of DEP RATE and THICKNESS. These are the following:

DEP RATE: The programmed deposition rate, in Angstrom units per second, input by the operator for the process step.

THICKNESS: The programmed coating thickness, in Microns, input by the operator, at which the process step is to terminate.

Derived Values are suggested new values from the Empirical and Process values entered by the operator as defined above. The new values suggested are for the CALCULATED OUTER POWER, CALCULATED INNER POWER, CALCULATED TIME and CALCULATED DUTY CYCLE, defined as follows:

CALCULATED OUTER POWER: The calculated outer sputtering power of the dual plasma target suggested for the process step on the next wafer (in KW).

CALCULATED INNER POWER: The calculated inner sputtering power of the dual plasma target suggested for the process step on the next wafer (in KW).

CALCULATED TIME: The calculated process time for the step on the next wafer (in Seconds, 1 to 300).

CALCULATED DUTY CYCLE: The calculated ratio, for the next wafer, of the on-time or portions of the cycle during which the outer coal and inner coil are activated.

The calculations are performed in accordance with the following formulae:

$$\text{CALCULATED TIME} = \frac{\text{THICKNESS} \cdot 100}{\text{DEP RATE}}$$

$$R = \frac{\text{MEAS THICKNESS OUTER} - \text{MEAS THICKNESS INNER}}{\text{MEAS THICKNESS OUTER} + \text{MEAS THICKNESS INNER}}$$

$$R'' = R \times 100$$

$$R' = C_A + C_B R'' + C_C R''^2 + C_D R''^3 + C_E R''^4$$

$$R_C = \frac{\text{MEAS THICKNESS INNER}}{1.0 + R'}$$

$$R_D = \text{MEAS THICKNESS INNER} - R_C$$

CALC POWER OUTER =

$$\frac{\text{POWER OUTER}}{1.789 \, R_C} \times \frac{\text{DEP RATE}}{222}$$

CALC POWER INNER =

$$\frac{1.789 \times \text{POWER INNER}}{.789 \, R_D} \times \frac{\text{DEP RATE}}{222}$$

If CALC OUTER POWER > TARGET MATERIAL LIMIT, then:

$$\text{ADJUSTMENT RATIO} = \frac{\text{CALC POWER OUTER}}{\text{TARGET MATERIAL LIMIT}}$$

CALC DUTY CYCLE =

DUTY CYCLE × ADJUSTMENT RATIO $$\text{CALC OUTER POWER} = \frac{\text{CALC OUTER POWER}}{\text{ADJUSTMENT RATIO}}$$

$$\text{CALC INNER POWER} = \frac{\text{CALC INNER POWER}}{\text{ADJUSTMENT RATIO}}$$

The function keys available from the CALCULATE PROCESS screen are:

LOAD PROCESS: The LOAD PROCESS function retrieves parameters from memory to the screen for a given process in the same manner as with the CREATE PROCESS SPUT (DUAL PLASMA) screen.

SAVE PROCESS: The SAVE PROCESS function saves process parameters (derived values) from the screen to memory for a given process in the same manner as from the CREATE process screen.

PASS 2: The PASS 2 option generates a second screen for the creation of a 2-pass process in the respective processing chamber in the same manner as from the CREATE PROCESS SPUT (DUAL PLASMA) screen.

CALCULATE VALUES: The CALCULATE VALUES function causes a calculation of a new set of suggested values for certain Empirical parameters and Process Values.

RESET EMPIRICAL VALUES: The RESET EMPIRICAL VALUES function zeroes Empirical values on the screen for re-entry, except for kilowatt-hours.

SAVE EMPIRICAL VALUES: The SAVE EMPIRICAL VALUES function saves the newly entered empirical values, appearing on the screen, replacing the previously stored values.

CREATE SPUT (−1, −2 or −3): The CREATE SPUT function transfers to the corresponding one of the CREATE SPUT screens.

Upon entering a CALCULATE PROCESS screen, all relevant data entered on the CREATE PROCESS menu are duplicated onto the CALCULATE PROCESS screen. A message "Values Not Calculated" appears on the screen. When the operator presses a function key identified on the screen as corresponding to a CALCULATE VALUES function, the Calculated Values are displayed. These values are not necessarily or automatically used in the programmed process. The Derived values are copied to the CREATE PROCESS menus. The operator may choose to use the suggested values or can edit the values on the CREATE PROCESS menus. In either case the values are not stored unless the save process function is used.

Whenever the QUALIFY function has been selected from the PROCESS CONTROL menu, however, four wafers are cycled into the system. Simultaneously, each of these wafers is processed in one and only one chamber, and only in accordance with the process specified in the process ID for that chamber. Then, the four wafers are cycled out of the system through the loadlock. Whenever a QUALIFY run has been successfully completed, the programmed parameters of Outer Power, Inner Power, Duty Cycle and process Time, are written to the appropriate fields in the Empirical Values and the operator entered values of Measured Thickness Inner and Outer are set to zero. These values will thereafter replace the previously displayed Empirical values on the CALCULATE PROCESS screens.

Referring to FIG. 5G, the CREATE PROCESS SPUT (REGAS/PULSE) submenu is similar to the CREATE PROCESS SPUT (DUAL PLASMA) submenus except for the following differences: the Fixed Parameters REGAS 1, REGAS 2 and PULSE ON/OFF replace the Fixed Parameter DUTY CYCLE; the Step Parameters DC POWER, or RF VOLT, ETCH VOLT, BIAS, and REGAS 1 & 2 replace the Step Parameters OUTER POWER, INNER POWER, DEP RATE, and THICKNESS; and:

REGAS 1 & 2: The identity of the reactive sputtering gas (under Fixed Parameters), and the flow rate of the gas (under Step Parameters).

PULSE ON/OFF: The pulse ON/OFF times for the reactive gasses (in Seconds; ON time from 0.50 to 2.00 sec. OFF time from 0.20 to 1.00 sec.)

DC POWER: The power to the target (in KW, 0.5 KW to 30 KW).

RF VOLT: The DC offset voltage as the result of an RF excitation applied to the cathode (in Volts, replacing DC power).

ETCH VOLT: The DC offset voltage as the result of an RF excitation applied to the backplane (in Volts, in etching chamber, replaces the DC POWER or RF VOLT).

The CREATE ETCH/LOADLOCK submenu (Not shown) includes the relevant parameters described under the CREATE PROCESS SPUT (REGAS/PULSE) screen above.

Referring to FIG. 5H, fault and warning values are entered for Etch Voltage (for Etch chamber), for all sputtering power values and the bias voltage (entered for each sputtering chamber), and for all gas flow and temperature values (entered for each chamber). Default values are set at 10% for the warning values and 15% for the fault values. The warning values control when warning signals are generated, while the fault values determine when processes are to be terminated in the respective process chambers. Average readings over an interval are required before a fault or warning is triggered. Faults and warnings are logged by time and date.

Referring to FIG. 5I, from the PROCESS CONTROL QUEUE menu, the processing of batches of wafers is controlled. From the PROCESS QUEUE, the following data may be entered:

BATCH ID: An identification number for the batch to be run.

PROCESS ID: The identification number of the process to be run on the batch.

CASSETTES: The number (quantity) of cassettes in the batch to be run according to the selected process.

When processing is started, the various settings and system parameters are checked. The locations of all wafers are maintained as wafers travel through the machine, and the data relating to the processes performed on each identified wafer are recorded. Data storage is provided for recording the processes and locations of 5000 wafers or 10 batches of 500 wafers each.

Processes are run in the order queued. From this screen, processes may be added to or deleted from the queue. Batches may be also inserted into the queue list to be run between batches.

Having described the invention in its preferred embodiments, it will be appreciated by those skilled in the art that variations thereof may be made without departing from its principles.

Accordingly, what is claimed is as follows:

1. A method of manufacturing a sputter coated article, comprising the steps of:
   providing a sputter coating apparatus having a processing chamber in which a sputter coating material is deposited onto a substrate by a sputter coating process performed with the apparatus operated in accordance with a plurality of machine parameters;
   supporting in the chamber a target of sputter coating material and a substrate holder holding a first substrate with a surface of the substrate facing the target to receive a coating of sputter coating material sputtered from the target;
   entering, into a processor, process parameters including the desired thickness of a coating to be deposited on the substrate by performance of the process thereon and the desired deposition rate at which the coating is to be deposited on the substrate;
   calculating, from the entered process parameters, machine parameters for energizing the target to sputter material therefrom to deposit a coating at the desired deposition rate and to the desired thickness onto the substrate; and
   electrically energizing the target to cause sputtering therefrom in accordance with the calculated machine parameters to perform the sputter coating process on the substrate supported in the processing chamber to deposit coating material on the substrate at the desired deposition rate and to the desired thickness.

2. The method of claim 1 further comprising the steps of:
   storing in a memory the calculated machine parameters by which the process was performed on the substrate;
   measuring the thickness of the coating deposited on the substrate by the performance of the process thereon;

further calculating with the processor, in response to the measured coating thickness, the stored machine parameters, and the entered process parameters, new machine parameters in accordance with which the process may be initiated;

supporting a second substrate in the chamber;

further energizing the target to cause sputtering therefrom in accordance with the calculated new machine parameters to perform the sputter coating process on the second substrate supported in the processing chamber to deposit coating material on the substrate at the desired deposition rate and to the desired thickness.

3. The method of claim 1 wherein:

the target has a plurality of sputtering regions thereon;

the calculating step includes the step of separately adjusting machine parameters applicable to different ones of the regions of the target; and initiating the performance of a process on a substrate supported in the processing chamber by energizing the different regions of the target differently in accordance with the separately adjusted machine parameters.

4. The method of claim 3 wherein:

the separately adjusted machine parameters include those affecting the power levels to which the target is to be energized to cause sputtering from the respective regions thereof.

5. A method of manufacturing a sputter coated article, comprising the steps of:

providing a sputter coating apparatus having a processing chamber in which a sputter coating material is deposited onto a substrate by a sputter coating process performed with the apparatus operated in accordance with a plurality of machine parameters;

supporting in the chamber a target of sputter coating material, having a plurality of sputtering regions thereon, and a substrate holder holding a substrate with a surface of the substrate facing the target to receive a coating of sputter coating material sputtered from the plurality of regions of the target;

storing in a memory the desired thickness of the coating to be deposited on the substrate by performance of the process thereon;

entering measured data of the coating thickness distribution on a substrate coated by a prior performance thereon of the process in accordance with previously set machine parameters;

calculating modified machine parameters from the entered measured data of the coating thickness distribution, the stored desired thickness and the previously set machine parameters; and performing the process on the substrate supported in the processing chamber to deposit the desired thickness of coating material on the substrate in accordance with the modified machine parameters.

6. The method of claim 5 wherein:

the measured data entering step includes the step of measuring the coating thickness at a plurality of points on the surface of the substrate coated by the prior performance of the process thereon to produce the measured data of the coating thickness distribution.

7. The method of claim 6 wherein the calculating step includes the step of:

separately adjusting respective machine parameters applicable to each of the regions of the target from the measured data of the coating thickness distribution.

8. The method of claim 7 wherein:

the target is annular and the regions thereon include an inner region and an outer annular region surrounding the inner region; and the measured data entering step includes the step of entering data of coating thickness measured at inner and outer portions of the surface of the substrate coated by the prior performance thereon of the process in accordance with the previously set machine parameters.

9. The method of claim 5 wherein:

the modified machine parameters include machine parameters affecting the power levels to which the target is energized to cause the sputtering from the respective regions thereof.

10. A sputter coating apparatus comprising:

a processing chamber in which a sputter coating material is deposited onto a substrate by a sputter coating process, the chamber having supported therein:

a target of sputter coating material, and a substrate holder for supporting a substrate such that a surface of the substrate faces the target to receive a coating of sputter coating material sputtered from the target;

a data processor having means for receiving and storing entered process parameter data including:

data of the desired thickness of a coating to be deposited on a substrate by performance of the process thereon, and data of the desired deposition rate at which the coating is to be deposited on the substrate;

means for electrically energizing the target to cause sputtering therefrom in accordance with machine parameters communicated thereto to perform the sputter coating process on a substrate supported in the substrate holder;

the data processor including means for calculating, from the entered process parameter data, machine parameters for performing the sputter coating process so as to deposit, at the desired deposition rate, a coating on the substrate of the desired thickness; and means connected to the data processor for communicating the calculated machine parameters to the target energizing means.

11. The apparatus of claim 10 wherein:

the data processor includes means for storing machine parameters in accordance with which a process has been performed on a previously processed substrate;

the data processor includes means for receiving and storing measured data of coating thickness distribution on the previously processed substrate; and the calculating means is operative to calculate the calculated machine parameters from both the measured coating thickness distribution data and the entered process parameter data.

12. The apparatus of claim 10 wherein:

the calculating means includes means for calculating separate sets of machine parameters for each of a plurality of different regions of the target in accordance with the calculated machine parameters;

the energizing means is operative to energize the different regions of the target in accordance with the communicated machine parameters;

the communicating means is operative to independently communicate the separate calculated machine parameters to the target energizing means.

13. The apparatus of claim 12 wherein:

the separate sets of calculated machine parameters each include machine parameters affecting the power level to which the target is energized to cause sputtering from the respective regions.

14. An apparatus for manufacturing a sputter coated article, comprising:

a processing chamber in which a sputter coating material is deposited onto a substrate by a sputter coating process, the chamber having supported therein:
   a target of sputter coating material having a plurality of sputtering regions thereon, and
   a substrate holder for supporting a substrate such that a surface of the substrate faces the target to receive a coating of sputter coating material sputtered from the regions of the target;

means for electrically energizing the target to cause sputtering from the regions thereof in accordance with machine parameters communicated thereto;

a data processor;

means for entering into the data processor data of the desired thickness of the coating to be deposited on the substrate;

the data processor including:
   means for storing machine parameters in accordance with which a process has been performed on a previously processed substrate;
   means for receiving and storing measured data of coating thickness deposited on the substrate previously processed in accordance with the stored parameters; and
   means for calculating modified machine parameters from the stored machine parameters, the measured data of coating thickness and the data of desired coating thickness; and means connected to the data processor for communicating the modified machine parameters to the target energizing means.

15. The apparatus of claim 14 further comprising:

means connected to the measured data receiving means for measuring coating thickness at a plurality of points on the surface of the previously processed substrate to produce coating thickness distribution data.

16. The apparatus of claim 15 wherein the calculating means includes:

means for separately adjusting the machine parameters applicable to each respective region of the target in response to the measured thickness distribution data.

17. The apparatus of claim 16 wherein:

the target is annular and the regions thereof include an inner region and an outer annular region surrounding the inner region; and the coating thickness measuring means includes means for measuring the data of coating thickness near both inner and outer portions of the coated surface of the previously processed substrate.

18. The apparatus of claim 14 wherein:

the modified machine parameters include machine parameters affecting the power levels to which the target is energized to cause the sputtering from the respective regions thereof.

19. A method of manufacturing a sputter coated article, comprising the steps of:

providing a sputter coating apparatus having a processing chamber in which a sputter coating material is deposited onto a substrate by a sputter coating process performed with the apparatus operated in accordance with a plurality of machine parameters;

supporting in the chamber a target of sputter coating material, having a plurality of sputtering regions thereon, and a substrate holder holding a substrate with a surface of the substrate facing the target to receive a coating of sputter coating material sputtered from the plurality of regions of the target;

storing initial machine parameters in a memory;

entering alternative machine parameters into the memory;

displaying to an operator the stored initial machine parameters and the alternative machine parameters;

receiving from an operator parameter selection commands and process initiating commands;

selecting, in response to the commands received from the operator, selected machine parameters from among the stored initial machine parameters and the stored alternative machine parameters; and performing a sputter coating process on a substrate supported in the processing chamber in accordance with the selected machine parameters by electrically energizing the target so as to independently cause sputtering from each region respectively in accordance with separate machine parameters including the selected machine parameters.

20. The method of claim 19 wherein:

the alternative machine parameter entering step includes the step of receiving the alternative machine parameters from an operator.

21. The method of claim 19 further comprising the steps of:

receiving from an operator and storing in the memory the desired coating thickness; and the alternative machine parameter entering step including the step of calculating the alternative machine parameters at least partly from said desired coating thickness;

the process performing step including the step of energizing the target to a power level, the alternative parameters that are calculated including the power level to which the target is energized.

22. The method of claim 19 further comprising the step of:

storing in the memory measured data from a prior performance of the process on a substrate.

23. The method of claim 22 further comprising the step of:

calculating the alternative parameters at least partly from the measured data.

24. The method of claim 22 wherein:

the measured data is data of the thickness of coating deposited in the prior performance of the process on the previously processed substrate.

25. The method of claim 24 further comprising the step of:

calculating the alternative parameters at least partly from the data of the thickness.

26. The method of claim 25 further comprising the step of:
receiving from an operator and storing in the memory data of a desired coating thickness.

27. The method of claim 26 further comprising the step of:
receiving from an operator and storing in the memory data of a desired deposition rate.

28. The method of claim 27 wherein:
the alternative parameters include the power levels to which the target is to be energized, the power levels being calculated at least partly from said measured and desired coating thickness data and desired deposition rate data.

29. The method of claim 26 wherein:
the alternative parameters include the power levels to which the target is energized, the power levels being calculated at least partly from said measured and desired coating thickness data.

30. The method of claim 22 wherein:
the measured data is data of the thickness of coating, deposited on a substrate by the prior performance of the process thereon, measured at a plurality of points on the substrate.

31. The method of claim 30 further comprising the steps of:
calculating a plurality of alternative parameters respectively relating to each of the plurality of regions of the target, the calculating being at least partly from the data of coating thickness measured at the plurality of points on the previously processed substrate.

32. The method of claim 30 further comprising the steps of:
receiving from an operator and storing in the memory the desired thickness of the coating to be deposited on the substrate.

33. The method of claim 32 further comprising the step of:
receiving from an operator and storing in the memory the desired deposition rate at which the coating is to be deposited on the substrate.

34. The method of claim 33 wherein:
the calculated alternative parameters include the power levels to which the plurality of regions of the target are energized, the power levels being calculated at least partly from the measured coating thickness data, the desired coating thickness and the desired deposition rate.

35. The method of claim 33 wherein:
the calculated alternative parameters include the relative duration of the time intervals during which each of the plurality of regions of the target is to be energized when the process is performed on the substrate, the intervals being calculated at least partly from the measured data of coating thickness and the desired coating thickness.

36. The method of claim 35 further comprising the steps of:
receiving from an operator and storing in the memory the upper power limit of the target; and
the calculated relative duration of the time intervals during which the plurality of regions of the target is to be energized being calculated at least partly from the entered upper power limit.

37. The method of claim 32 wherein:
the calculated alternative parameters include the power levels to which each of the plurality of regions of the target is to be energized when a process is performed on the substrate, the power levels being calculated at least partly from the measured data of coating thickness and the desired coating thickness.

38. The method of claim 37 wherein:
the calculated alternative parameters include the relative duration of the time intervals during which each of the plurality of regions of the target is to be energized when the process is performed on the substrate, the intervals being calculated at least partly from the measured data of coating thickness and desired coating thickness;
the method further comprising the steps of receiving from an operator, and storing in the memory, data of the upper power limit of the target; and
the calculated relative duration of the time intervals during which each of the plurality of regions of the target is to be energized being calculated at least partly from the entered power limit data.

39. The method of claim 19 further comprising the step of:
receiving from an operator the measured data from a prior performance of the process; and
storing in the memory the measured data from the prior performance of the process received from the operator.

40. The method of claim 19 further comprising the step of:
measuring the data from a prior performance of the process; and
storing in the memory the measured data from the prior performance of the process.

41. The method of claim 19 further comprising the steps of:
receiving from an operator and storing in the memory data of desired process parameters.

42. The method of claim 19 further comprising the steps of:
receiving from an operator, and storing in the memory, a desired process parameter; and
calculating, at least partly from the process parameter, the alternative parameters, including parameters in accordance with which each of the plurality of regions of the target is to be energized.

43. The method of claim 19 wherein:
the target includes a single piece of sputtering material having at least two of the regions thereon.

44. The method of claim 43 wherein:
the process is performed by energizing the two regions of the target alternately.

45. The method of claim 19 wherein:
the target includes at least two concentric regions, including an inner region and an outer region; and
the method further comprises the steps of calculating the different alternative machine parameters for each of the regions of the target and energizing the inner and outer regions of the target separately in accordance with different respective machine parameters.

46. A sputter coating apparatus comprising:
a processing chamber in which a sputtered coating material is deposited onto a substrate by a process, the chamber having supported therein:
a target of sputter coating material having a plurality of sputtering regions thereon, and
a substrate holder for supporting a substrate such that a surface of the substrate faces the target to receive a coating of sputter coating material sputtered from the regions of the target;

means for electrically energizing the target to independently cause sputtering from each region in accordance with stored parameters communicated thereto;

memory means for holding stored parameters therein;

entry means including means for entering alternative parameters;

the entry means including means for receiving from an operator parameter selection commands and process initiating commands;

display means for displaying to an operator the stored parameters and the alternative parameters;

control means including means responsive to parameter selection commands received from the operator for selecting parameters, from among the stored and alternative parameters; and the control means including means responsive to the initiating commands received from the operator for communicating the selected parameters to the energizing means to initiate the performance of the process on a substrate supported in the processing chamber in accordance with the selected parameters.

47. The apparatus of claim 46 wherein:
the alternative parameter entering means includes means for receiving the alternative parameters from an operator.

48. The apparatus of claim 46 wherein:
the entry means includes means for receiving from an operator, and storing in the memory means, data of a desired coating thickness; and
the alternative parameter entering means comprises means for calculating the alternative parameters at least partly from said data of desired coating thickness, the calculated alternative parameters including the power levels to which the regions of the target will be energized.

49. The apparatus of claim 46 wherein:
the entry means includes means for receiving from an operator, and storing in the memory means, desired process parameters.

50. The apparatus of claim 46 wherein:
the memory means includes means for storing measured data from a prior performance of the process on a substrate.

51. The apparatus of claim 50 wherein:
the entry means includes means for receiving from an operator, and storing in the memory means, the measured data from the prior performance of the process.

52. The apparatus of claim 50 further comprising:
means for measuring the data from the prior performance of the process.

53. The apparatus of claim 50 further comprising:
means for calculating the alternative parameters at least partly from said data.

54. The apparatus of claim 50 wherein:
the measured data is data of the thickness of coating deposited on a substrate by the prior performance of the process thereon.

55. The apparatus of claim 54 further comprising:
means for calculating the alternative parameters at least partly from said data of the thickness of the coating.

56. The apparatus of claim 54 wherein:
the entry means includes means for receiving from an operator, and storing in the memory means, data of a desired coating thickness.

57. The apparatus of claim 56 wherein:
the entry means includes means for receiving from an operator, and storing in the memory means, data of a desired deposition rate.

58. The apparatus of claim 57, further comprising:
means for calculating the alternative parameters at least partly from said data; and
wherein the calculated alternative parameters include the power levels to which the target regions are energized, the power levels being calculated at least partly from said measured and desired coating thickness data and desired deposition rate data.

59. The apparatus of claim 56, further comprising:
means for calculating the alternative parameters at least partly from said data; and
wherein the calculated alternative parameters include the power levels to which the target regions are energized, the power levels being calculated at least partly from said measured and desired coating thickness data.

60. The apparatus of claim 50 wherein:
the measured data is data of the thickness of coating deposited on a substrate, by the prior performance of the process thereon, measured at a plurality of points on the substrate.

61. The apparatus of claim 60 further comprising:
means for calculating a plurality of alternative parameters respectively affecting each of the plurality target regions, the parameters being calculated at least partly from said data of coating thickness at a plurality of points on the substrate.

62. The apparatus of claim 60 wherein:
the entry means includes means for receiving from an operator, and storing in the memory means, data of a desired coating thickness.

63. The apparatus of claim 62 wherein:
the entry means includes means for receiving rom an operator, and storing in the memory means, data of a desired deposition rate.

64. The apparatus of claim 63 wherein:
the calculated alternative parameters include the power levels to which the plurality of regions of the target are energized, the power levels being calculated at least partly from said measured and desired coating thickness data and desired deposition rate data.

65. The apparatus of claim 63 wherein:
the calculated alternative parameters include the relative duration of the time intervals during which each of the plurality of regions of the target is energized, the duration being calculated at least partly from said measured and desired coating thickness data.

66. The apparatus of claim 65 wherein:
the entry means includes means for receiving from an operator, and storing in the memory means, data of the upper power limit of the target; and
the calculated relative duration of the time intervals during which the plurality of regions of the target is energized is calculated at least partly from said entered power limit data.

67. The apparatus of claim 50, further comprising means for calculating alternative parameters, wherein:
the calculated alternative parameters include the power levels to which each of the plurality of regions of the target is energized is calculated at least partly from said measured and desired coating thickness data.

68. The apparatus of claim 67 wherein:

the calculated alternative parameter include the relative duration of time intervals during which each of the plurality of regions of the target is energized, the duration being calculated at least partly from said measured and desired coating thickness data;

the entry means includes means for receiving from the operator, and storing in the memory means, data of the upper power limit of the target; and the calculated relative duration of the time intervals during which each of the plurality of regions of the target is energized is calculated at least partly from said entered power limit data.

69. The apparatus of claim 46 wherein:

the entry means includes means for receiving from the operator, and storing in the memory means, data of the desired process parameters; and the apparatus further comprises means for calculating, at least partly from said data, the alternative parameters in accordance with which each of the plurality of regions of the target are energized.

70. The apparatus of claim 46 wherein:

the target includes a single piece of sputtering material having at least two of the regions thereon.

71. The apparatus of claim 70 wherein:

the energizing means is operative to cause the two regions of the target to be energized alternately.

72. The apparatus of claim 46 wherein:

the target includes at least two concentric regions, including an inner region and an outer region; and the apparatus further comprises means for calculating separate alternative parameters in accordance with which each of the plurality of regions of the target is respectively energized.

* * * * *